(12) United States Patent
Park et al.

(10) Patent No.: US 7,671,395 B2
(45) Date of Patent: Mar. 2, 2010

(54) PHASE CHANGE MEMORY CELLS HAVING A CELL DIODE AND A BOTTOM ELECTRODE SELF-ALIGNED WITH EACH OTHER

(75) Inventors: Jae-Hyun Park, Gyeonggi-do (KR); Jae-Hee Oh, Gyeonggi-do (KR); Se-Ho Lee, Seoul (KR); Won-Cheol Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/240,267

(22) Filed: Sep. 29, 2008

(65) Prior Publication Data

US 2009/0026439 A1 Jan. 29, 2009

Related U.S. Application Data

(62) Division of application No. 11/389,996, filed on Mar. 27, 2006, now Pat. No. 7,442,602.

(30) Foreign Application Priority Data

Jun. 20, 2005 (KR) .......................... 10-2005-53217

(51) Int. Cl.
*H01L 27/108* (2006.01)

(52) U.S. Cl. .................... 257/303; 438/153; 438/202; 438/237; 438/241; 438/244; 257/185; 257/232; 257/250; 257/304; 257/316; 257/328; 257/337

(58) Field of Classification Search ................. 438/138, 438/328; 257/144

See application file for complete search history.

(56) References Cited

U.S. PATENT DOCUMENTS

| 6,153,890 A | 11/2000 | Wolstenholme et al. |
| 6,420,725 B1 * | 7/2002 | Harshfield ..................... 257/4 |
| 7,291,556 B2 | 11/2007 | Choi et al. |
| 7,427,531 B2 | 9/2008 | Cho et al. |
| 2005/0029587 A1 | 2/2005 | Harshfield |
| 2005/0042862 A1 | 2/2005 | Zahorik |
| 2005/0248035 A1 | 11/2005 | Son et al. |

OTHER PUBLICATIONS

Chinese Office Action (10 pages) corresponding to Chinese Patent Application No. 200610089834.X.; Mailing Date: Dec. 4, 2008.
English Translation of Chinese Office Action (9 pages) corresponding to Chinese Patent Application No. 200610089834.X.

* cited by examiner

*Primary Examiner*—N Drew Richards
*Assistant Examiner*—Kyoung Lee
(74) *Attorney, Agent, or Firm*—Myers Bigel Sibley & Sajovec

(57) ABSTRACT

Integrated circuit devices are provide having a vertical diode therein. The devices include an integrated circuit substrate and an insulating layer on the integrated circuit substrate. A contact hole penetrates the insulating layer. A vertical diode is in lower region of the contact hole and a bottom electrode in the contact hole has a bottom surface on a top surface of the vertical diode. The bottom electrode is self-aligned with the vertical diode. A top surface area of the bottom electrode is less than a horizontal section area of the contact hole. Methods of forming the integrated circuit devices and phase change memory cells are also provided.

35 Claims, 18 Drawing Sheets

PHASE CHANGE MEMORY CELLS HAVING A CELL DIODE AND A BOTTOM ELECTRODE SELF-ALIGNED WITH EACH OTHER

CROSS-REFERENCE TO RELATED APPLICATION

This application is a divisional application of and claims priority to U.S. patent application Ser. No. 11/389,996, filed Mar. 27, 2006, now U.S. Pat. No. 7,442,602, which claims priority from Korean Patent Application No. 10-2005-0053217, filed Jun. 20, 2005, the disclosure of which is hereby incorporated by reference herein in its entirety.

BACKGROUND OF THE INVENTION

The present invention relates to semiconductor memory devices and methods of fabricating the same and, more particularly, to phase change memory devices and methods of fabricating the same.

Nonvolatile memory devices retain their stored data even when their power supplies are turned off. As such, nonvolatile memory devices have been widely used in conjunction with computers, mobile telecommunication systems, memory cards and so on. For example, one widely used type of nonvolatile memory device is the flash memory device. Many flash memory devices employ memory cells having a stacked gate structure. The stacked gate structure of a flash memory device typically includes a tunnel oxide layer, a floating gate, an inter-gate dielectric layer and a control gate electrode, which are sequentially stacked on a channel region. Further, to enhance the reliability and programming efficiency of flash memory cells, the film quality of the tunnel oxide layer may be improved and the coupling ratio of the flash memory cell may be increased.

Recently, other types of nonvolatile memory devices, for example, phase change memory devices, are being used in place of flash memory devices in some applications. A unit cell of a phase change memory device typically includes a cell switching device and a phase change resistor electrically connected to the cell switching device. The phase change resistor typically includes a top electrode and a bottom electrode as well as a phase change material layer between the top and bottom electrodes. The cell switching device may be an active device, such as a Metal-Oxide-Silicon (MOS) transistor. In this case, a large program current of at least a few milli-ampere (mA) is generally required to program the phase change memory cell, and the program currents are supplied through the cell MOS transistor. As such, there may be limits as to how much the area that the cell MOS transistor occupies may be reduced. In other words, when a MOS transistor is employed as the switching device of the phase change memory cell, it may be difficult to enhance the integration density of the phase change memory device.

In an attempt to enhance integration density of a phase change memory device, a vertical diode has been used as the cell switching device of the phase change memory device. A phase change memory cell having the vertical diode is described in U.S. Pat. No. 6,511,862 B2 to Hudgens et al., entitled "Modified Contact for Programmable Devices." As described in Hudgens et al., an isolation layer is formed in a predetermined region of a semiconductor substrate to define an active region, and a word line and a vertical cell diode are formed in the active region. A contact, such as a metal silicide layer, is then formed on the vertical cell diode, and an insulating layer is formed on the substrate having the contact. The insulating layer is patterned to form an opening that exposes the contact, and a spacer and a confined programmable material layer (i.e., a confined phase change material layer) are formed in the opening.

In the process of Hudgents et al., the opening may be misaligned with the vertical cell diode, and the phase change material layer is in direct contact with the metal silicide layer. Therefore, there may be still a limit to how much the phase change memory cell size may be reduced. In addition, the metal silicide layer may react with the phase change material layer during a subsequent annealing process, which may degrade the properties of the phase change material layer.

SUMMARY OF THE INVENTION

Embodiments of the present invention include integrated circuit devices having a vertical diode. The devices include an integrated circuit substrate and an insulating layer on the integrated circuit substrate. A contact hole penetrates the insulating layer. A vertical diode is in a lower region of the contact hole and a bottom electrode in the contact hole is on a top surface of the vertical diode. The bottom electrode is self-aligned with the vertical diode. A top surface area of the bottom electrode is less than a horizontal section area of the contact hole. T.

In some embodiments, the top surface of the bottom electrode may have a level relative to the integrated circuit substrate substantially the same as a top surface of the insulating layer.

In other embodiments, an insulating spacer surrounds a sidewall of the bottom electrode. An outer sidewall of the insulating spacer is self-aligned with a sidewall of the vertical diode by the contact hole. The insulating layer and the insulating spacer may be a same material. The insulating layer and the insulating spacer may be silicon oxide. A diode electrode may be provided between the bottom electrode and the vertical diode.

In further embodiments a memory storage element is electrically coupled to the bottom electrode. A cell select line on the integrated circuit substrate is electrically coupled to the bottom electrode through the vertical diode to define a memory cell. The memory storage element may include a phase change material pattern layer on the bottom electrode and a top electrode on the phase change material pattern layer.

In other embodiments, the insulating layer includes a first insulating layer on the integrated circuit substrate and a second insulating layer on the first insulating layer. The second insulating layer has an etch selectivity with respect to the first insulating layer.

In yet further embodiments, phase change memory cells include an insulating layer on an integrated circuit substrate. A cell contact hole penetrates the insulating layer. A vertical cell diode is in a lower region of the cell contact hole and a bottom electrode is in the cell contact hole on the vertical cell diode and self-aligned with the vertical cell diode. A phase change material layer pattern is on the bottom electrode and a top electrode is on the phase change material layer pattern. A top surface of the bottom electrode may have a substantially same level as a top surface of the insulating layer.

In other embodiments, an insulating spacer surrounds a sidewall of the bottom electrode. An outer sidewall of the insulating spacer is self-aligned with a sidewall of the vertical cell diode by the cell contact hole. A top surface area of the bottom electrode may be less than a horizontal section area of the cell contact hole. The insulating layer may be a single layer and the insulating layer may be a same material as the insulating spacer.

In further embodiments, the insulating layer includes a first insulating layer on the integrated circuit substrate and a second insulating layer on the first insulating layer. The second insulating layer is an insulating layer having an etch selectivity with respect to the first insulating layer. The second insulating layer may be a same material as the insulating spacer. A cell diode electrode may be provided between the bottom electrode and the vertical cell diode.

In other embodiments, an upper insulating layer is on the phase change material pattern and the top electrode. A bit line on the upper insulating layer is electrically connected to the top electrode through a bit line contact hole penetrating the upper insulating layer. A word line may be disposed on the integrated circuit substrate and the cell contact hole may extend through the insulating layer to expose a portion of the word line. The word line may be an n-type impurity region. The insulating layer may be a silicon oxide layer. A silicon oxide spacer may surround a sidewall of the bottom electrode and an outer sidewall of the silicon oxide spacer may be self-aligned with a sidewall of the vertical cell diode by the cell contact hole. The bit line may be disposed to cross over the word line.

In some embodiments, the first insulating layer is a silicon oxide layer and the second insulating layer is a silicon oxynitride layer and/or a silicon nitride layer. The insulating spacer may be a silicon oxynitride spacer and/or a silicon nitride spacer. p In further embodiments, methods of forming an integrated circuit device including a vertical diode are provided. An insulating layer is formed on an integrated circuit substrate. A sacrificial layer is formed on the insulating layer and a cell contact hole is formed penetrating the sacrificial layer and the insulating layer. A vertical cell diode is formed in a lower region of the cell contact hole and a preliminary bottom electrode is formed filling the cell contact hole. The sacrificial layer is removed without removing the preliminary bottom electrode to provide a protruding portion of the preliminary bottom electrode. The protruding portion of the preliminary bottom electrode is planarized to form a bottom electrode in the cell contact hole having a top surface that is located at a substantially same level as a top surface of the lower insulating layer.

In other embodiments, forming the preliminary bottom electrode is preceded by forming an insulating spacer on a sidewall of the cell contact hole on the vertical cell diode and removing the sacrificial layer includes removing the sacrificial layer without removing the insulating spacer to provide a protruding portion of the insulating spacer. Planarizing the protruding portion of the preliminary bottom electrode includes planarizing the protruding portion of the insulating spacer. Forming the insulating layer may be preceded by forming a word line on the integrated circuit substrate and forming the cell contact hole may include forming the cell contact hole to expose a portion of the word line. The word line may be an n-type impurity region.

In further embodiments, the insulating layer is formed of a single insulating Layer. and the sacrificial layer is formed of a material layer having an etch selectivity with respect to the single insulating layer. The single insulating layer may be a silicon oxide layer and the sacrificial layer may be a silicon nitride layer and/or a silicon oxynitride layer. The insulating spacer may be a same material as the single insulating layer.

In yet other embodiments, forming the insulating layer includes forming a first insulating layer on the integrated circuit substrate and forming a second insulating layer on the first insulating layer. The sacrificial layer may be a material having an etch selectivity with respect to the second insulating layer. The first insulating layer and the sacrificial layer may be a silicon oxide layer and the second insulating layer may be a silicon oxynitride layer and/or a silicon nitride layer. The insulating spacer may be formed of a same material as the second insulating layer. Forming a preliminary bottom electrode may be preceded by forming a cell diode electrode on a surface of the vertical cell diode. The cell diode electrode may be a metal silicide layer.

In further embodiments, the preliminary bottom electrode is a titanium nitride (TiN) layer, a titanium aluminum nitride (TiAlN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium boron nitride (TiBN) layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum aluminum nitride (MoAlN) layer, a tantalum silicon nitride (TaSiN) layer, a tantalum aluminum nitride (TaAlN) layer, a titanium tungsten (TiW) layer, a titanium aluminum (TiAl) layer, a titanium oxynitride (TiON) layer, a titanium aluminum oxynitride (TiAlON) layer, a tungsten oxynitride (WON) layer and/or a tantalum oxynitride (TaON) layer.

In yet other embodiments, the integrated circuit device is a phase change memory cell and the method further includes forming a phase change material pattern on the bottom electrode and forming a top electrode on the phase change material pattern. An upper insulating layer is formed on the integrated circuit substrate in a region including the top electrode. A bit line is formed electrically connected to the top electrode on the upper insulating layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 5A through 11A are cross-sectional views taken along line I-I' of FIG. 2 illustrating methods of fabricating phase change memory cells according to some embodiments of the present invention;

FIGS. 5B through 11B are cross-sectional views taken along line II-II' of FIG. 2 illustrating methods of fabricating phase change memory cells according to some embodiments of the present invention;

FIGS. 12A through 15A are cross-sectional views taken along line I-I' of FIG. 2 illustrating methods of fabricating phase change memory cells according to other embodiments of the present invention; and FIGS. 12B through 15B are cross-sectional views taken along line II-II' of FIG. 2 illustrating methods of fabricating phase change memory cells according to other embodiment of the present invention.

DETAILED DESCRIPTION OF EMBODIMENTS OF THE INVENTION

Figure 1:
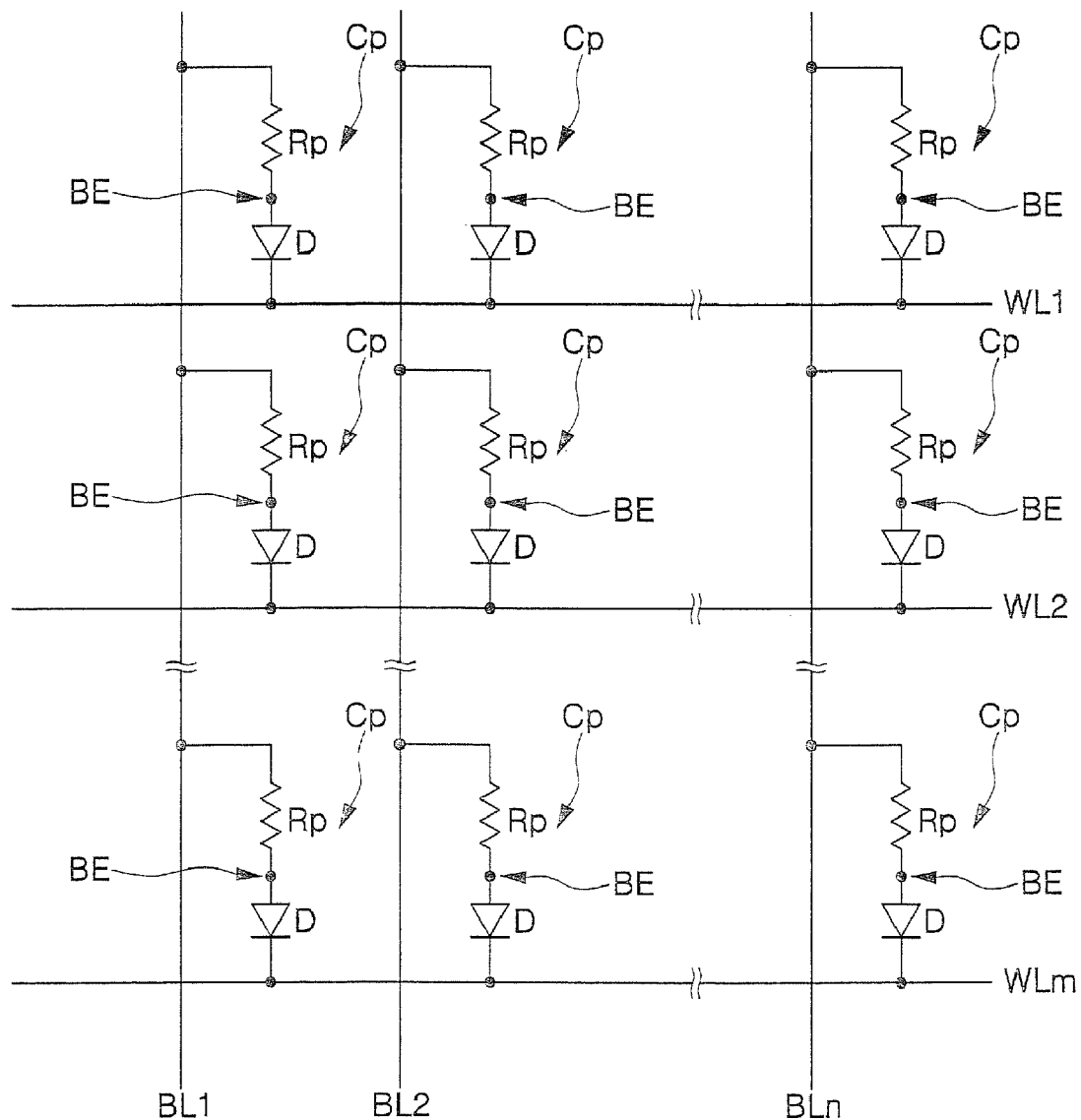
FIG. 1 is an equivalent circuit diagram illustrating a portion of a phase change memory cell array region that may be implemented according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an equivalent circuit diagram illustrating a portion of a phase change memory cell array region that may be implemented using some embodiments of the present invention. As illustrated in FIG. 1, the phase change memory cell array region includes n bit lines BL1, BL2, . . . , BLn, and m word lines WL1, WL2, . . . , WLm crossing the bit lines BL1, BL2, . . . , BLn. A plurality of two dimensionally arrayed phase change memory cells Cp are disposed at cross points of the bit lines BL1, BL2, . . . , BLn and the word lines WL1, WL2, . . . , WLm, respectively. Each of the phase change memory cells Cp includes a phase change resistor Rp and a vertical cell diode D, which are electrically connected in series. A node between the phase change resistor Rp and the vertical cell diode D is identified as a bottom electrode BE of the phase change resistor Rp in the embodiments of FIG. 1. The vertical cell diode D may include a p-type semiconductor and an n-type semiconductor.

The p-type semiconductor of the cell diode D may be electrically connected to one end of the phase change resistor Rp, and the other end of the phase change resistor Rp may be electrically connected to any one of the bit lines BL1, BL2, . . . , BLn. The n-type semiconductor of the cell diode D may be electrically connected to any one of the word lines WL1, WL2, . . . , WLm.

Figure 2:
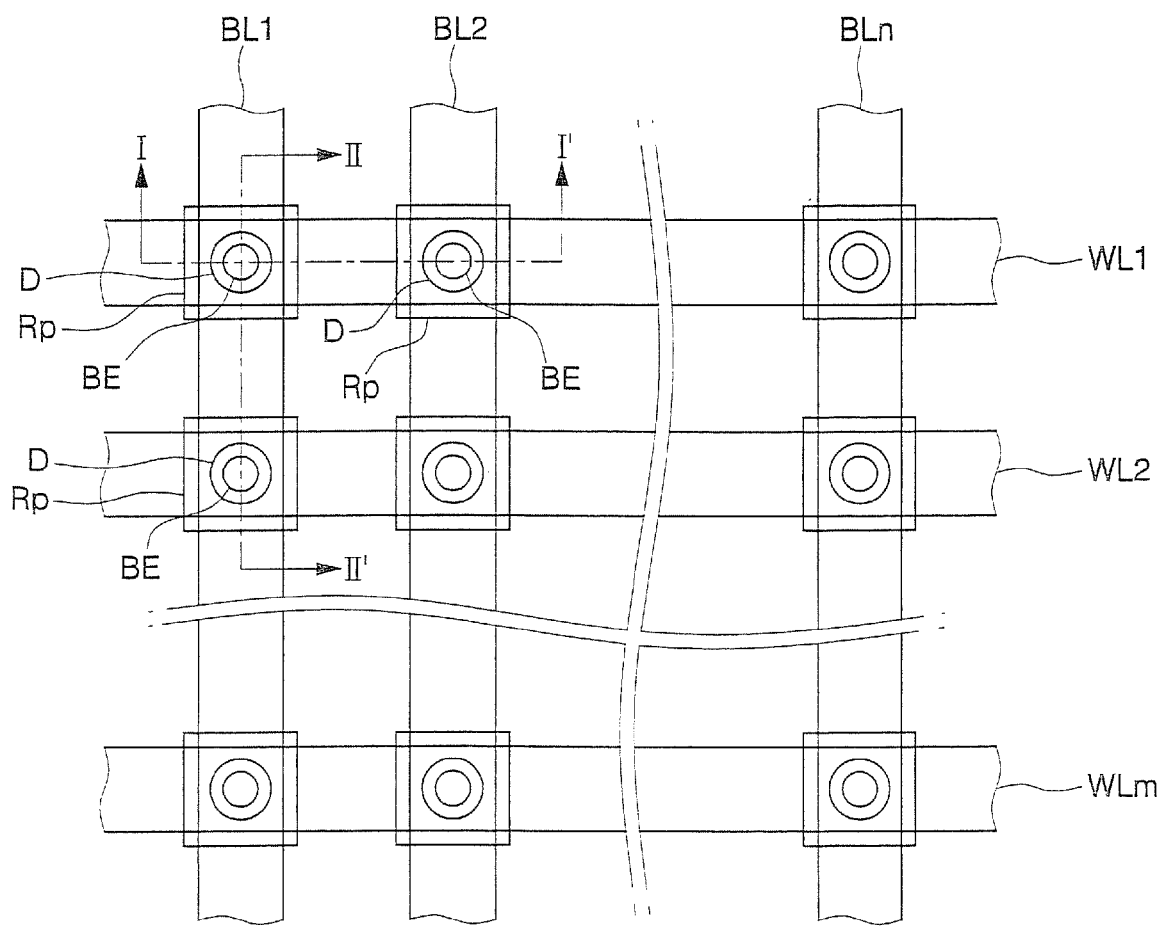
FIG. 2 is a plan view corresponding to the equivalent circuit diagram of FIG. 1 according to some embodiments of the present invention.
Figure 3A:
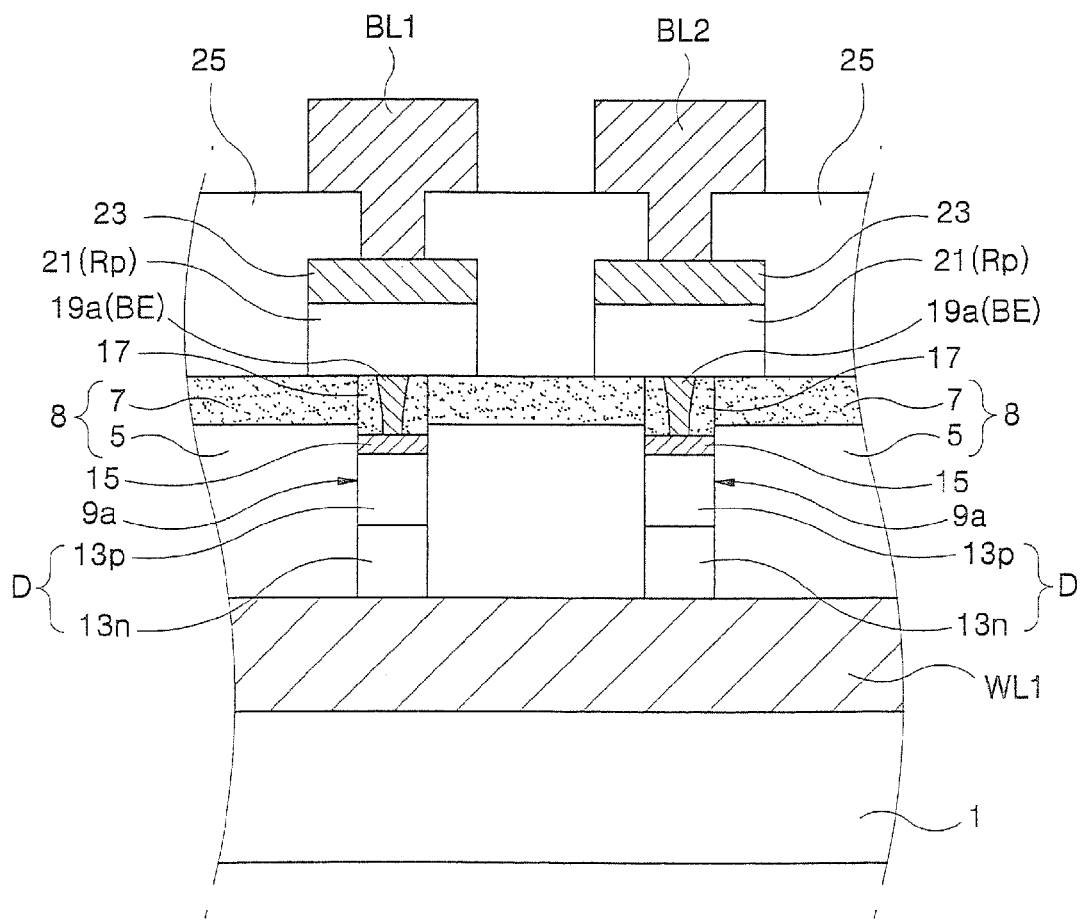
FIG. 3A is a cross-sectional view taken along line I-I' of FIG. 2 illustrating phase change memory cells according to some embodiments of the present invention.

Some embodiments of the present invention will now be further described with reference to FIGS. 2, 3A and 3B. FIG. 2 is a plan view of the phase change memory cell array region corresponding to the equivalent circuit diagram of FIG. 1 according to some embodiments of the present invention. FIG. 3A is a cross-sectional view taken along line I-I' of FIG. 2 and FIG. 3B is a cross-sectional view taken along line II-II' of FIG. 2.

Figure 3B:
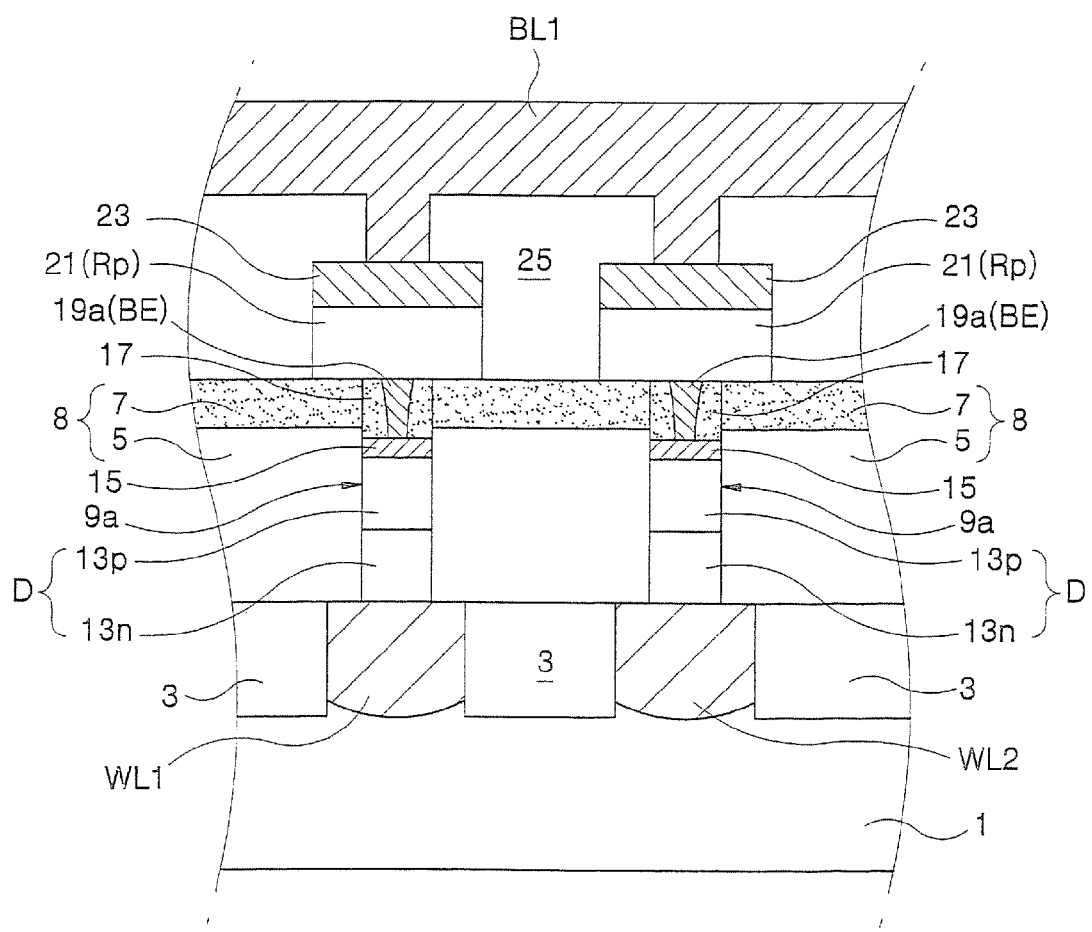
FIG. 3B is a cross-sectional view taken along line II-II' of FIG. 2 illustrating phase change memory cells according to some embodiments of the present invention.

Referring now to FIGS. 2, 3A and 3B, a plurality of word lines, for example, first and second parallel word lines WL1 and WL2, are provided on a semiconductor substrate 1. The word lines WL1 and WL2 may be active regions doped with n-type impurities. The word lines WL1 and WL2 may be electrically insulated from each other by an insulating layer, such as an isolation layer 3.

A lower insulating layer 8 is provided on the substrate 1 including the word lines WL1 and WL2. The lower insulating layer 8 may include a stacked first lower insulating layer 5 and second lower insulating layer 7. The second lower insulating layer 7 may be an insulating layer having an etch selectivity with respect to the first lower insulating layer 5. For example, the first lower insulating layer 5 may be a silicon oxide layer and the second lower insulating layer 7 may be a silicon oxynitride layer and/or a silicon nitride layer.

Predetermined regions of the word lines WL1 and WL2 are exposed by cell contact holes 9a penetrating the lower insulating layer 8. Lower regions of the cell contact holes 9a are filled with vertical cell diodes D. Each of the vertical cell diodes D may include a stacked n-type semiconductor 13n and p-type semiconductor 13p. Top surfaces of the vertical cell diodes D may be lower than a top surface of the lower insulating layer 8 as seen in FIG. 3B. Cell diode electrodes 15 may be provided on the top surfaces of the vertical cell diodes D. The cell diode electrodes 15 may be a metal silicide layer, such as a cobalt silicide layer, a nickel silicide layer and/or a titanium silicide layer.

Bottom electrodes 19a (BE of FIGS. 1 and 2) are provided inside the cell contact holes 9a on the vertical cell diodes D. Top surfaces of the bottom electrodes 19a have a substantially same level as the top surface of the lower insulating layer 8. Sidewalls of the bottom electrodes 19a may be surrounded by insulating spacers 17. In the illustrated embodiments, outer sidewalls of the insulating spacers 17 are self-aligned with sidewalls of the vertical cell diodes D by the cell contact holes 9a and the bottom electrodes 19a are self-aligned with the vertical cell diodes D. When the insulating spacers 17 are provided, top surfaces of the bottom electrodes 19a may have smaller areas than horizontal section areas of the cell contact holes 9a. The bottom electrodes 19a may be a conductive layer, such as a titanium nitride (TiN) layer, a titanium aluminum nitride (TiAlN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium boron nitride (TiBN) layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum aluminum nitride (MoAlN) layer, a tantalum silicon nitride (TaSiN) layer, a tantalum aluminum nitride (TaAlN) layer, a titanium tungsten (TiW) layer, a titanium aluminum (TiAl) layer, a titanium oxynitride (TiON) layer, a titanium aluminum oxynitride (TiAlON) layer, a tungsten oxynitride (WON) layer and/or a tantalum oxynitride (TaON) layer. The insulating spacers 17 may be the same material as the second lower insulating layer 7.

When the insulating spacers 17 are provided, lower surfaces of the bottom electrodes 19a may also have smaller areas than horizontal section areas of the cell contact holes 9a. In this case, if the bottom electrodes 19a directly contact the p-type semiconductors 13p of the vertical cell diodes D, most of the current passing through the bottom electrodes 19a may flow through central portions of the p-type semiconductors 13p. The current crowding effect may degrade a current drivability of the vertical cell diodes D. However, where the cell diode electrodes 15 are provided on the top surfaces of the p-type semiconductors 13p as seen in FIGS. 3A and 3B, the current passing through the bottom electrodes 19a may flow substantially uniformly through the vertical cell diodes D due to the presence of the cell diode electrodes 15. That is, the cell diode electrodes 15 may improve the current drivability of the vertical cell diodes D.

The bottom electrodes 19a are shown covered with phase change material patterns 21. The phase change material patterns 21 correspond to the phase change resistors Rp shown in FIGS. 1 and 2. The phase change material patterns 21 may be a chalcogenide layer, such as a GST alloy layer (an alloy layer of germanium, stibium and tellurium). Respective top electrodes 23 are shown disposed on the phase change material patterns 21. The top electrodes 23 may be a conductive layer, such as a titanium nitride layer.

An upper insulating layer 25 is provided on the substrate having the phase change material patterns 21 and the top electrodes 23. A plurality of bit lines, for example, first and second parallel bit lines BL1 and BL2, are disposed on the upper insulating layer 25. The bit lines BL1 and BL2 may be disposed to cross over the word lines WL1 and WL2. The bit lines BL1 and BL2 may be electrically connected to the top electrodes 23 through bit line contact holes penetrating the upper insulating layer 25.

Figure 4A:
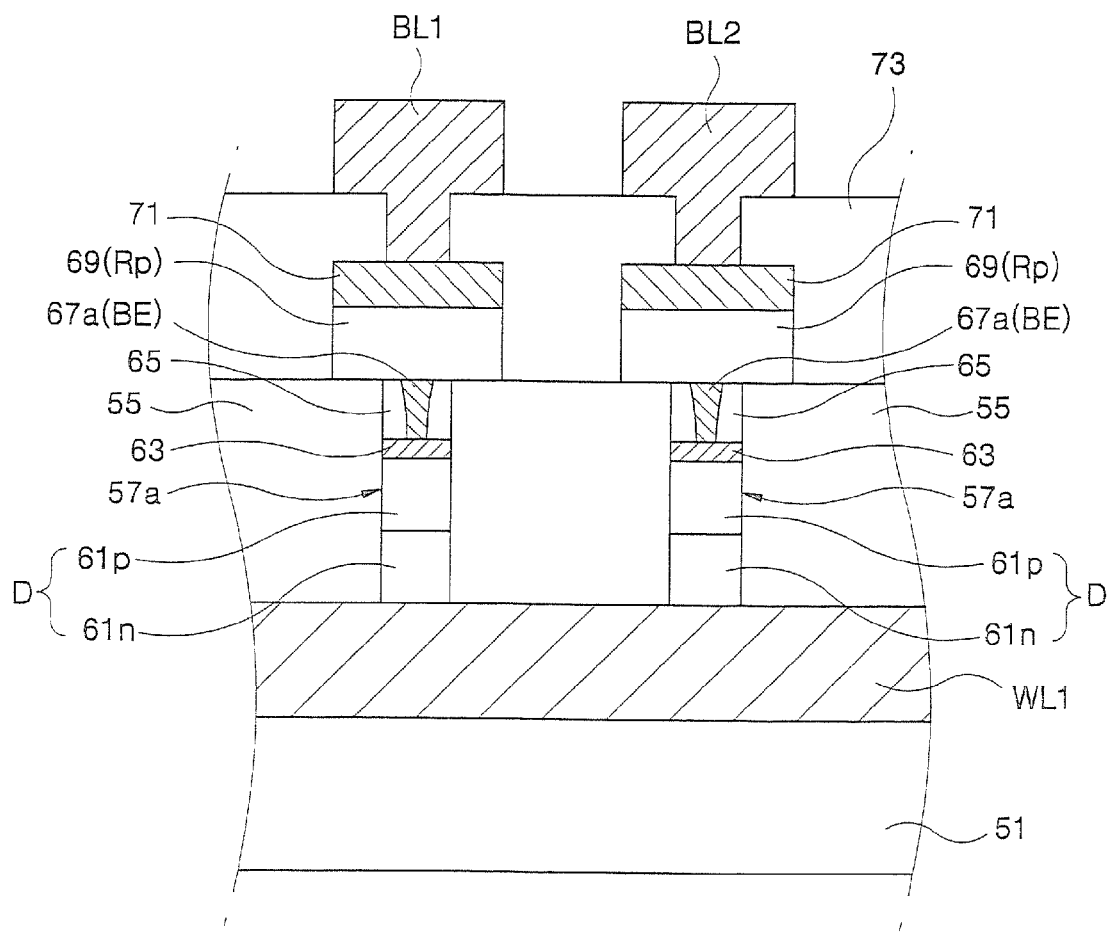
FIG. 4A is a cross-sectional view taken along line I-I' of FIG. 2 illustrating phase change memory cells according to other embodiments of the present invention.
Figure 4B:
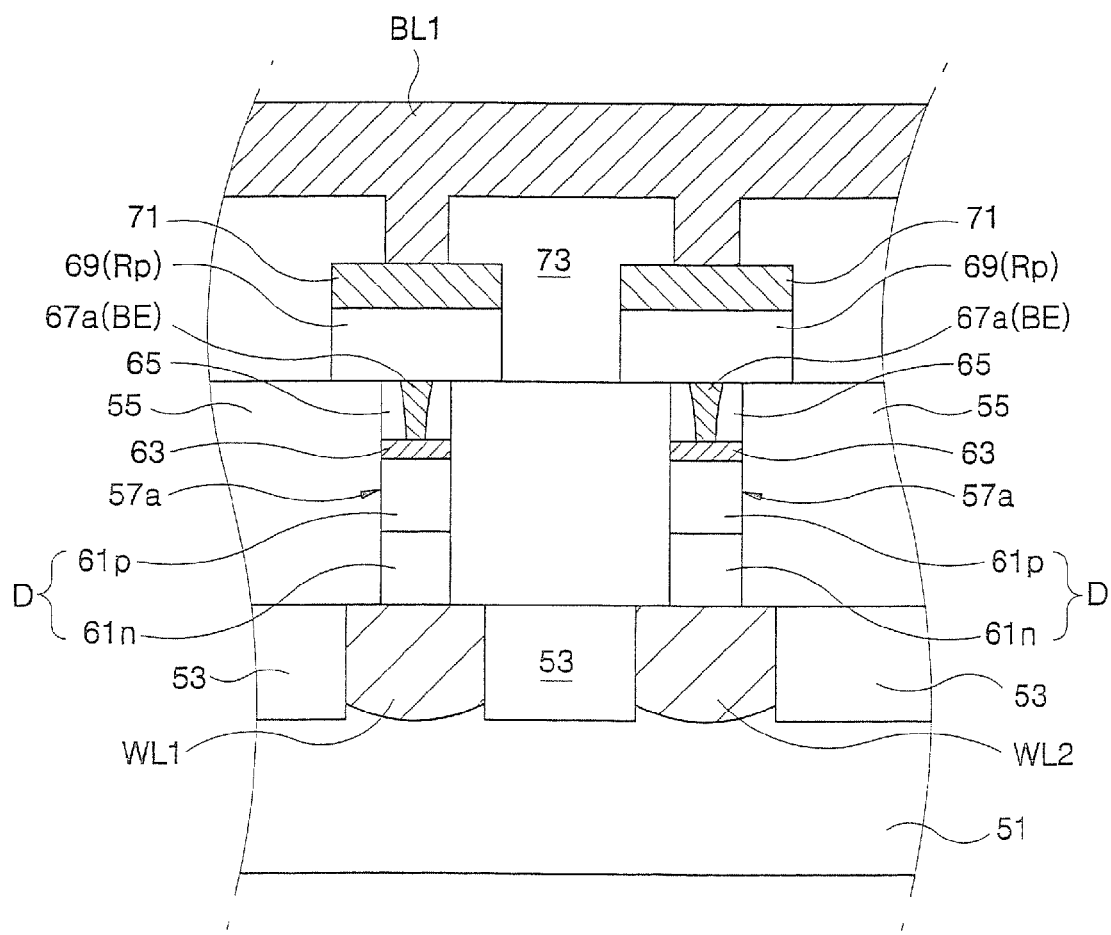
FIG. 4B is a cross-sectional view taken along line II-II' of FIG. 2 illustrating phase change memory cells according to other embodiments of the present invention.

Further embodiments of the present invention will now be described with reference to FIGS. 2, 4A and 4B. FIG. 4A is a cross-sectional view taken along line I-I' of FIG. 2 and FIG. 4B is a cross-sectional view taken along line II-II' of FIG. 2. Referring to FIGS. 4A and 4B, a plurality of word lines, for example, first and second word lines WL1 and WL2, are disposed on a semiconductor substrate 51. The word lines WL1 and WL2 may have the same shape as the word lines described with reference to FIGS. 3A and 3B. The word lines WL1 and WL2 may be electrically insulated from each other by an insulating layer, such as an isolation layer 53 (FIG. 4B).

A lower insulating layer 55 is provided on the substrate including the word lines WL1 and WL2. In the embodiments of FIGS. 4A and 4B, the lower insulating layer 55 is illustrated as a single insulating layer. The lower insulating layer 55 may be, for example, a single layer of silicon oxide. Predetermined regions of the word lines WL1 and WL2 may be exposed by cell contact holes 57a that penetrate the lower insulating layer 55. Respective vertical cell diodes D are provided inside lower regions of the cell contact holes 57a. Each of the vertical cell diodes D may include a stacked n-type semiconductor 61n and p-type semiconductor 61p, as described with reference to the diodes D of the embodiments of FIGS. 3A and 3B. Cell diode electrodes 63 may be provided on top surfaces of the vertical cell diodes D as described with reference to the electrodes 15 illustrated in FIGS. 3A and 3B. Bottom electrodes 67a (BE of FIGS. 1 and 2) may be provided inside the cell contact holes on the vertical cell diodes D.

Top surfaces of the bottom electrodes 67a have substantially the same level as the top surface of the lower insulating layer 55, as described previously with reference to the bottom electrodes 19a illustrated in FIGS. 3A and 3B. In addition, sidewalls of the bottom electrodes 67a may be surrounded by insulating spacers 65. The insulating spacers 65 and the bottom electrodes 67a are also self-aligned with the vertical cell diodes D by the cell contact holes 57a as described previously with reference the spacers 17 and bottom electrodes 19a illustrated in FIGS. 3A and 3B. When the insulating spacers 65 are provided, bottom surfaces and top surfaces of the bottom electrodes 67a may have smaller areas than horizontal section areas of the cell contact holes 57a. The bottom electrodes 67a may be the same material as the bottom electrodes 19a described with reference to FIGS. 3A and 3B and the insulating spacers 65 may be the same insulating layer material as the lower insulating layer 55.

Each of the bottom electrodes 67a is shown covered with a phase change material pattern 69 corresponding to the phase change resistors Rp. As illustrated in FIGS. 4A and 4B, top electrodes 71 are disposed on the respective phase change material patterns 69. The phase change material patterns 69 and the top electrodes 71 may be substantially the same as the phase change material patterns 21 and the top electrodes 23 described with reference to FIGS. 3A and 3B.

An upper insulating layer 73 is shown disposed on the substrate including the phase change material patterns 69 and the top electrodes 71 and bit lines BL1 and BL2 are provided on the upper insulating layer 73 as described previously with reference to the bit lines on the insulating layer 25 for the embodiment of FIGS. 3A and 3B.

For the embodiments shown in FIGS. 4A and 4B, the bottom electrodes 67a may be surrounded by spacers 65, which may be composed of a silicon oxide layer. The single lower insulating layer 55 may also be composed of a silicon oxide layer. In general, a silicon oxide layer exhibits lower heat conductivity than that of a silicon oxynitride layer or a silicon nitride layer. Thus, when program current flows through the bottom electrodes 67a, loss of the joule heat generated from the bottom electrodes 67a may be relatively reduced as compared to the embodiments described with reference to FIGS. 3A and 3B. As a result, a program efficiency of the phase change material patterns 69 may be improved.

Methods of fabricating phase change memory cells according to some embodiments of the present invention will now be described with reference to FIG. 2, FIGS. 5A through 11A and FIGS. 5B through 11B. FIGS. 5A through 11A are cross-sectional views taken along line I-I' of FIG. 2 and FIGS. 5B through 11B are cross-sectional views taken along line II-II' of FIG. 2.

Figure 5A:
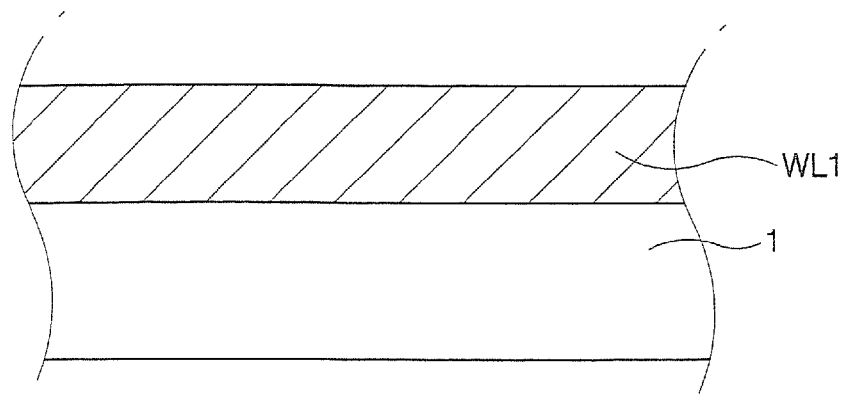
Figure 5B:
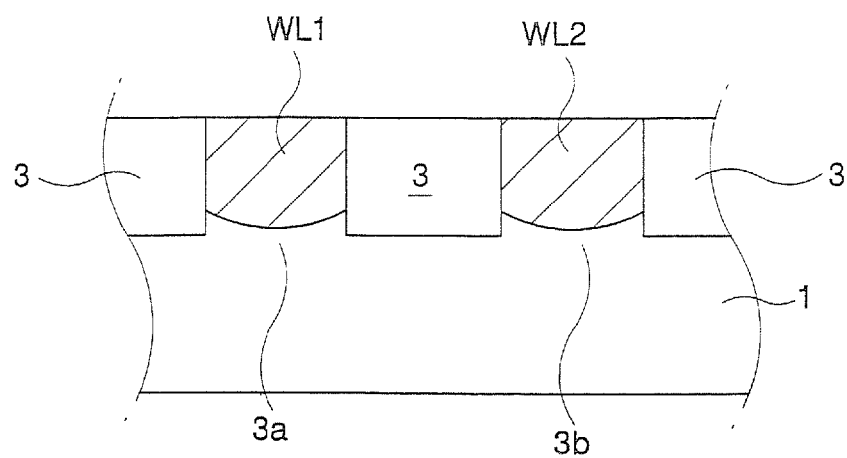

Referring first to FIGS. 5A and 5B, an isolation layer 3 is formed on a predetermined region of a semiconductor substrate 1 to define a plurality of active regions, for example, first and second parallel active regions 3a and 3b. Impurity ions having a different conductivity type from the semiconductor substrate 1 are implanted into the active regions 3a and 3b to form first and second word lines WL1 and WL2. As a result, the word lines WL1 and WL2 may be impurity regions having a different conductivity type from the semiconductor substrate 1. For example, when the semiconductor substrate 1 is a p-type semiconductor substrate, the word lines WL1 and WL2 may be formed by implanting n-type impurity ions.

In some embodiments, the word lines WL1 and WL2 may be formed using various other methods. For example, formation of the word lines WL1 and WL2 may include forming a plurality of parallel epitaxial semiconductor patterns on the semiconductor substrate 1 and implanting impurity ions into the epitaxial semiconductor patterns.

Figure 6A:
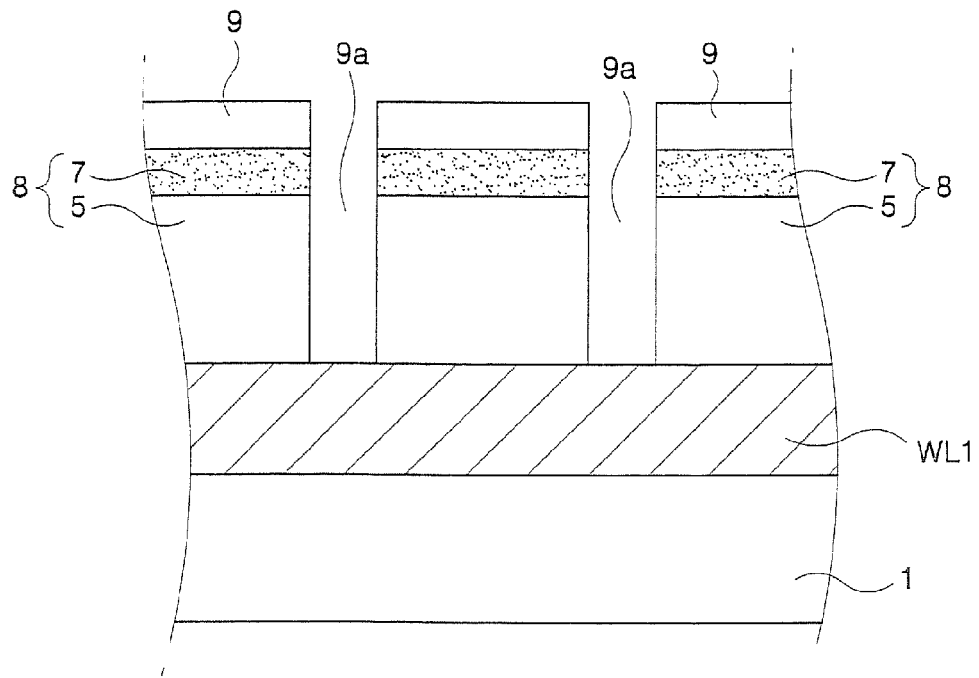
Figure 6B:
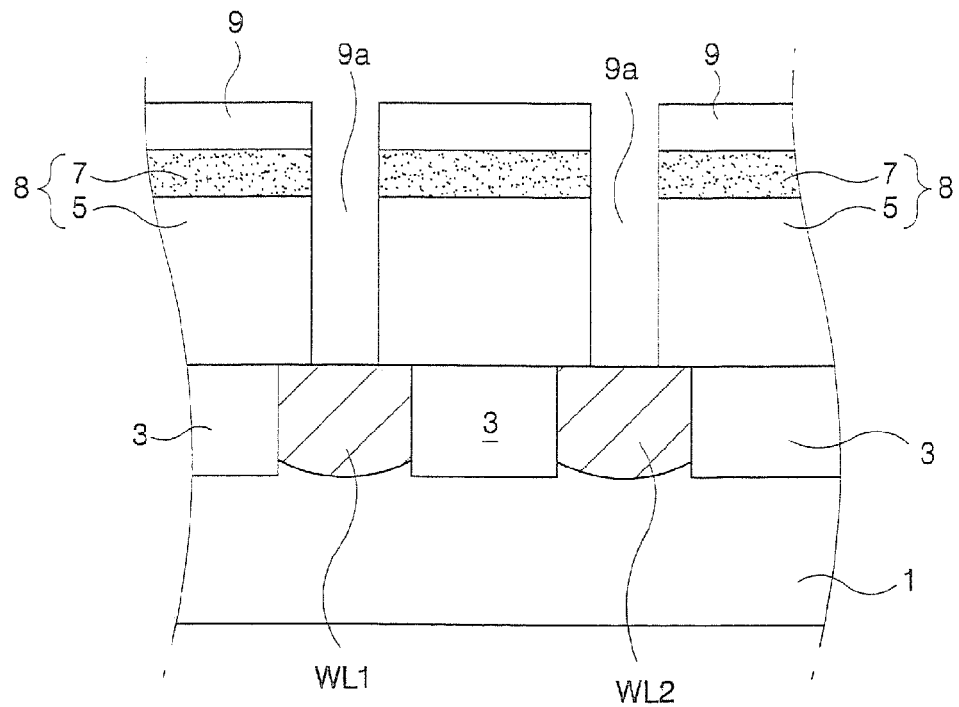

Referring now to FIGS. 6A and 6B, a lower insulating layer 8 and a sacrificial layer 9 are sequentially formed on the substrate 1 in a region including the word lines WL1 and WL2. The lower insulating layer 8 may be formed by sequentially stacking a first lower insulating layer 5 and a second lower insulating layer 7. The sacrificial layer 9 may be formed of a material layer having an etch selectivity with respect to the second lower insulating layer 7. The second lower insulating layer 7 may be formed of an insulating layer having an etch selectivity with respect to the first lower insulating layer 5. For example, the first lower insulating layer 5 and the sacrificial layer may be formed of a silicon oxide layer, and the second lower insulating layer 7 may be formed of a silicon oxynitride layer and/or a silicon nitride layer. The sacrificial layer 9 and the lower insulating layer 8 are patterned to form cell contact holes 9a exposing predetermined regions of the word lines WL1 and WL2.

Figure 7A:
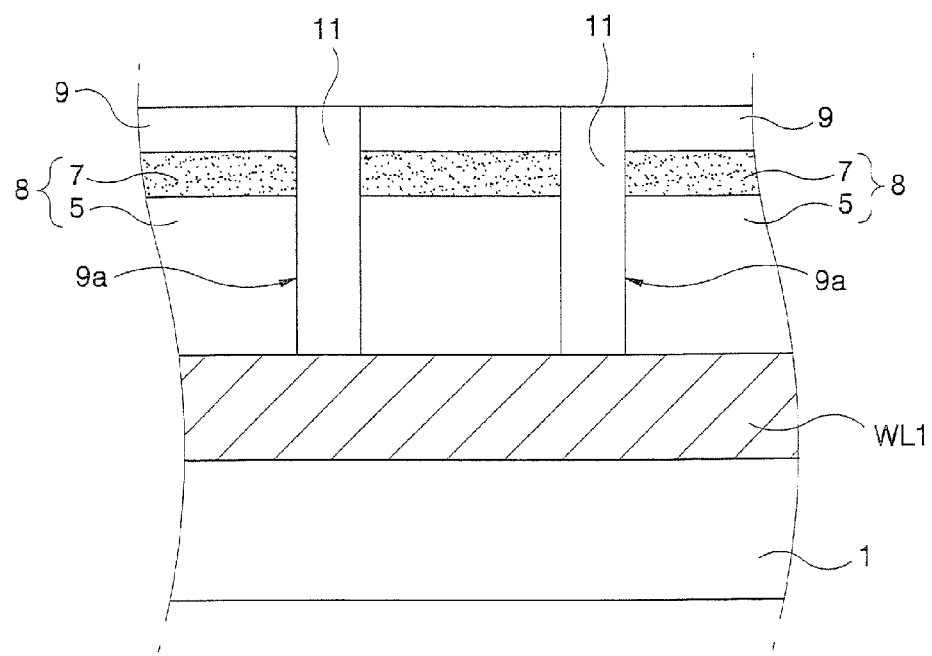
Figure 7B:
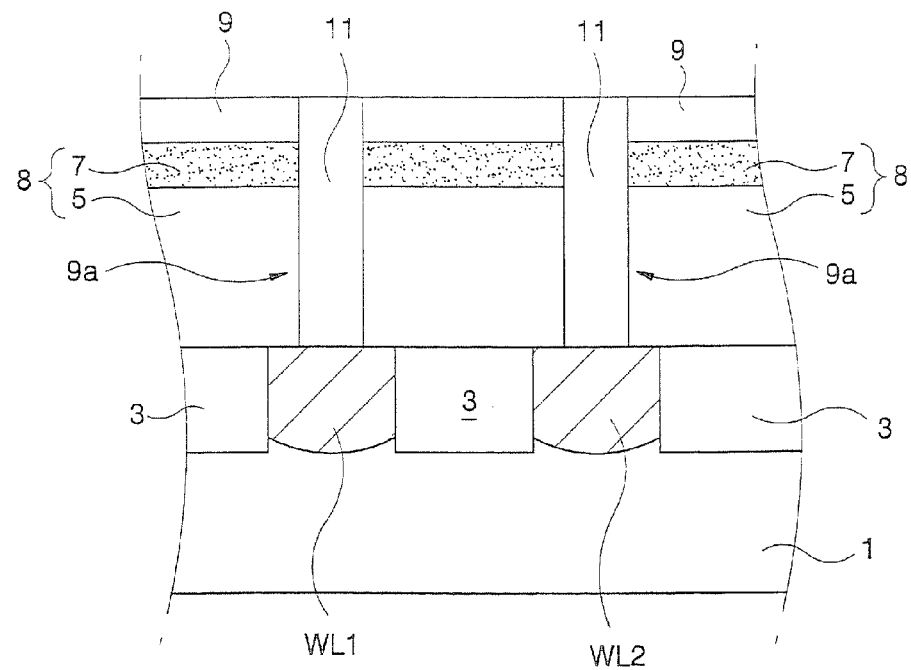

Referring to FIGS. 7A and 7B, semiconductor patterns 11, such as silicon patterns, germanium patterns and/or silicon germanium patterns, are formed in the respective cell contact holes 9a. The semiconductor patterns 11 may be formed using various methods. For example, the semiconductor patterns 11 may be formed using a selective epitaxial growth (SEG) technique that employs the exposed word lines WL1, WL2 as a seed layer. In other embodiments, formation of the semiconductor patterns 11 may include forming a semiconductor layer that fills the cell contact holes 9a on the sacrificial layer 9 and planarizing the semiconductor layer until a top surface of the sacrificial layer 9 is exposed. In this case, the semiconductor layer may be formed of an amorphous semiconductor layer and/or a polycrystalline semiconductor layer, and the semiconductor layer may be crystallized using a solid phase epitaxial (SPE) technique before or after planarization of the semiconductor layer. When the selective epitaxial growth technique or the solid phase epitaxial technique is used in formation of the semiconductor patterns 11, the word lines WL1 and WL2 may be impurity regions formed in the single crystalline semiconductor substrate 1.

Figure 8A:
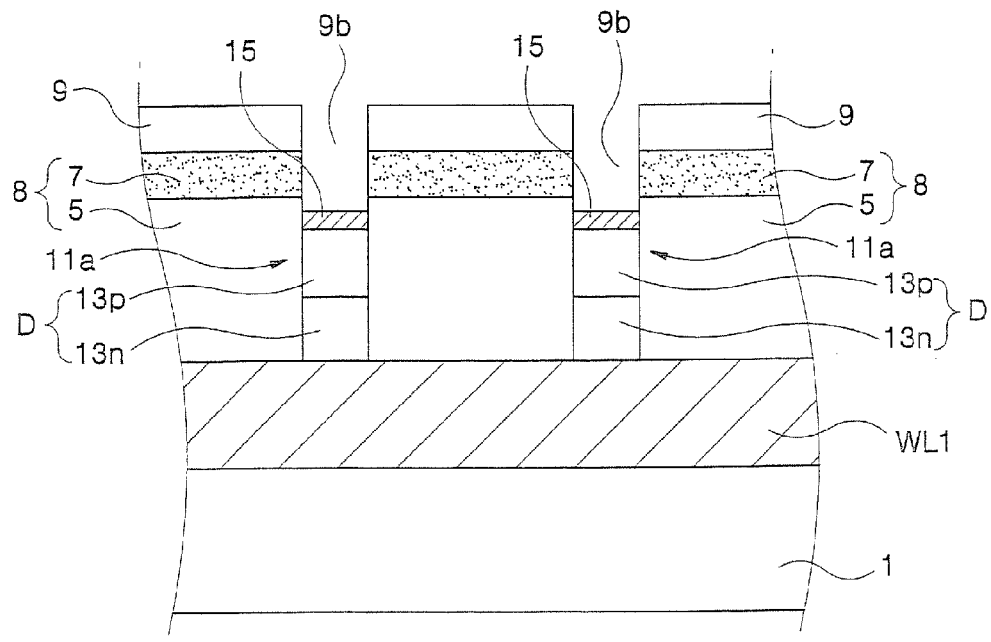
Figure 8B:
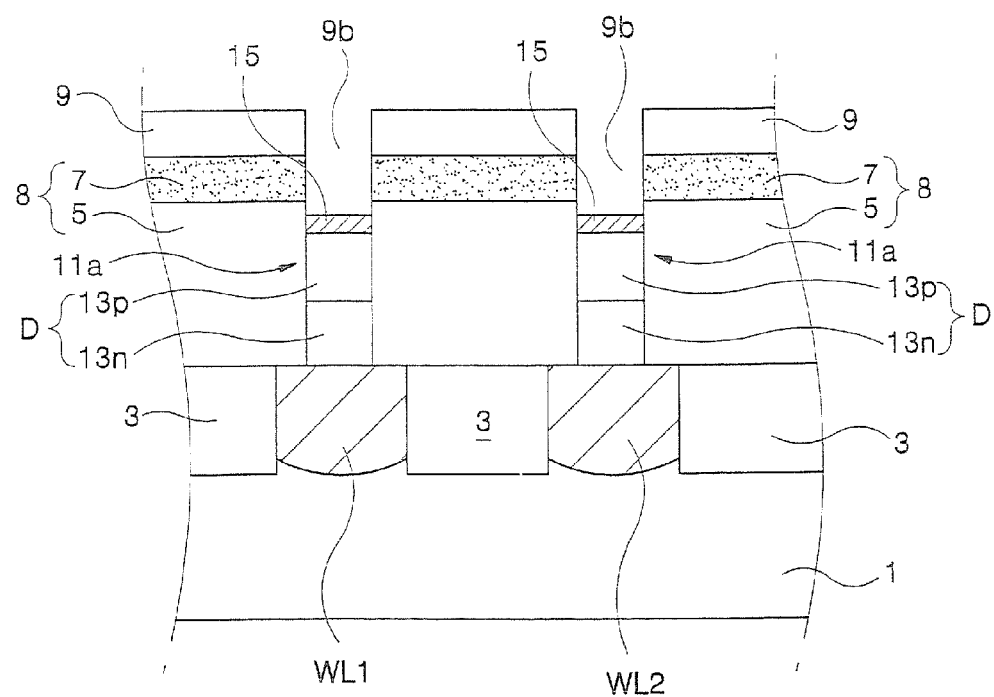

Referring now to FIGS. 8A and 8B, the semiconductor patterns 11 are etched back to form recessed semiconductor patterns 11a that exist in lower regions of the cell contact holes 9a. The recessed semiconductor patterns 11a may be formed to have top surfaces at a level lower than a top surface of the lower insulating layer 8 (that is, a top surface of the second lower insulating layer 7). As a result, upper cell contact holes 9b are provided on the recessed semiconductor patterns 11a.

N-type impurity ions may be implanted into lower regions of the recessed semiconductor patterns 11a to form n-type semiconductors 13n (e.g., n-type impurity regions) contacting the word lines WL1 and WL2, and p-type impurity ions may be implanted into upper regions of the recessed semiconductor patterns 11a to form p-type semiconductors 13p (e.g., p-type impurity regions) on the n-type semiconductors 13n. As a result, vertical cell diodes D may be formed inside lower regions of the respective cell contact holes 9a. The ion implantation process for forming the n-type semiconductors 13n may be performed after formation of the p-type semiconductors 13p.

Cell diode electrodes 15 may be formed on top surfaces of the vertical cell diodes D (e.g., top surfaces of the p-type semiconductors 13p). The cell diode electrodes 15 may be formed of a metal silicide layer, such as a cobalt silicide layer, a nickel silicide layer and/or a titanium silicide layer. The metal silicide layer may be formed using a silicide technique.

Figure 9A:
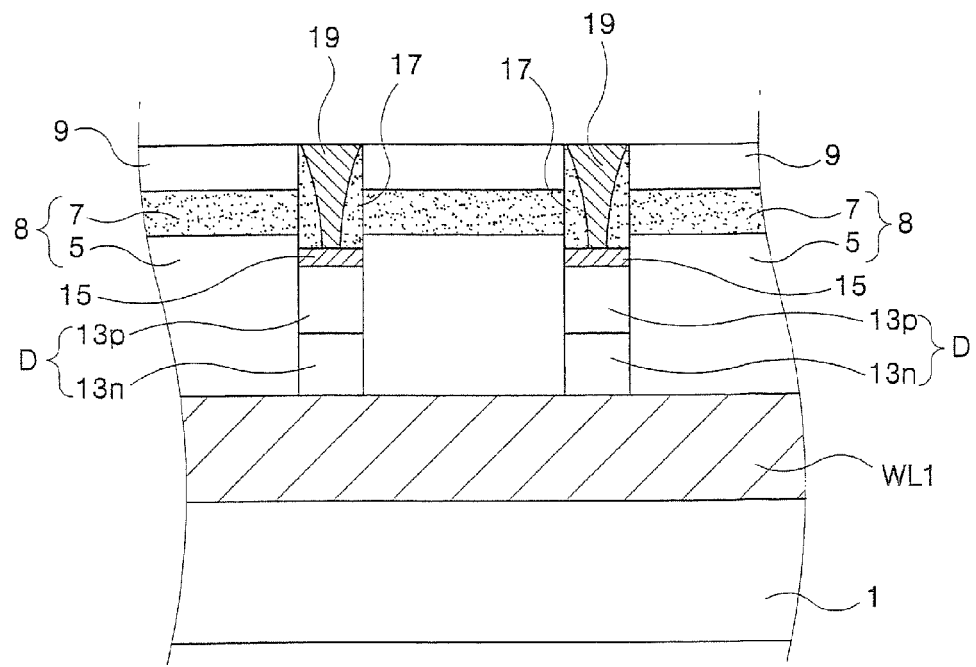
Figure 9B:
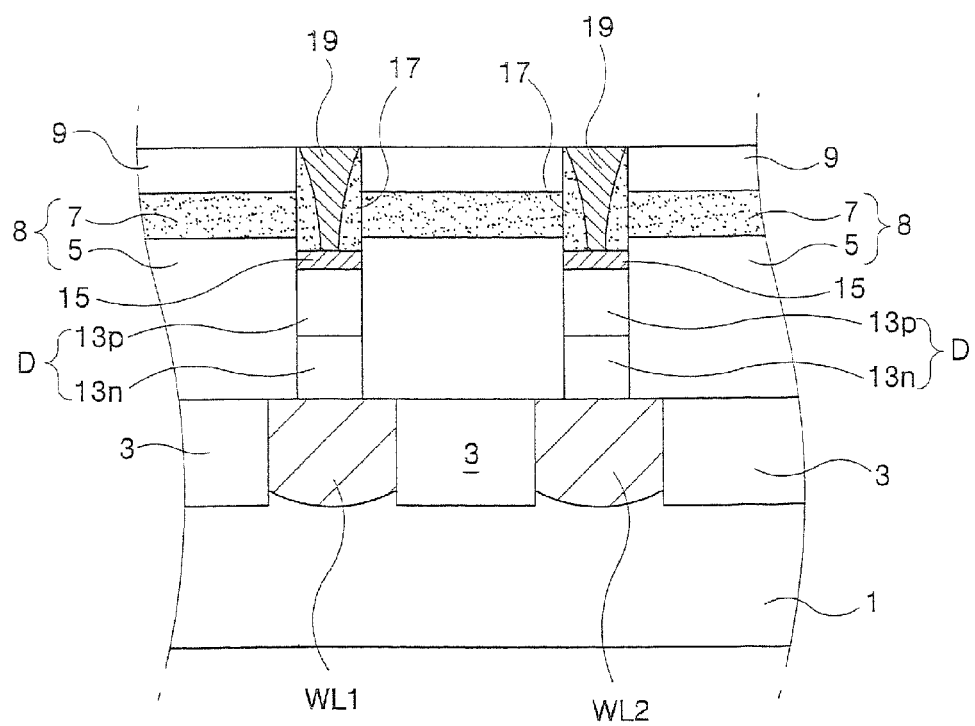

Referring now to FIGS. 9A and 9B, insulating spacers 17 may be formed on sidewalls of the upper cell contact holes (9b of FIGS. 8A and 8B). The insulating spacers 17 may be formed of an insulating layer having an etch selectivity with respect to the sacrificial layer 9. For example, the sacrificial layer 9 may be formed of a silicon oxide layer and the insulating spacers 17 may be formed of a silicon oxynitride layer and/or a silicon nitride layer.

In some embodiments of the present invention, the silicide process for forming the cell diode electrodes 15 may be performed after formation of the insulating spacers 17. In this case, as the insulating spacers 17 directly contact edge portions of the cell diodes 15, the cell diode electrodes 15 are formed on central portions of the cell diodes D, which are exposed after formation of the insulating spacers 17.

A bottom electrode layer is formed on the substrate 1 in a region including the cell diode electrodes 15 and the insulating spacers 17. The bottom electrode layer may be formed of a conductive layer, such as a titanium nitride (TiN) layer, a titanium aluminum nitride (TiAlN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium boron nitride (TiBN)

layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum aluminum nitride (MoAlN) layer, a tantalum silicon nitride (TaSiN) layer, a tantalum aluminum nitride (TaAlN) layer, a titanium tungsten (TiW) layer, a titanium aluminum (TiAl) layer, a titanium oxynitride (TiON) layer, a titanium aluminum oxynitride (TiAlON) layer, a tungsten oxynitride (WON) layer and/or a tantalum oxynitride (TaON) layer. The bottom electrode layer may be planarized to expose a top surface of the sacrificial layer 9. As a result, preliminary bottom electrodes 19 may be formed in empty regions surrounded by the insulating spacers 17, with the preliminary bottom electrodes 19 in contact with central top surfaces of the cell diode electrodes 15.

Figure 10A:
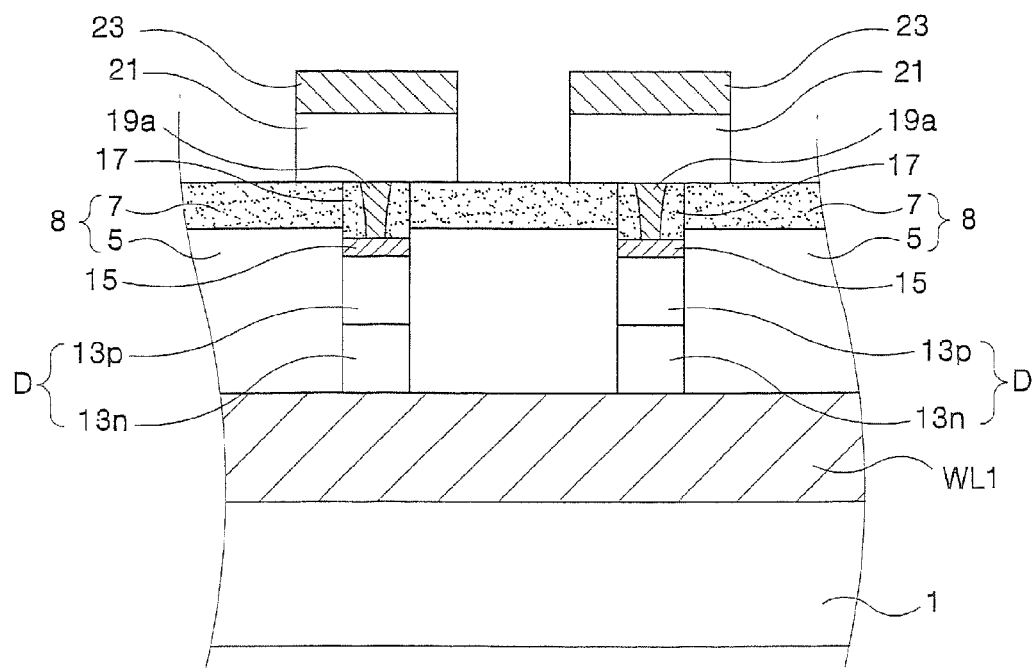
Figure 10B:
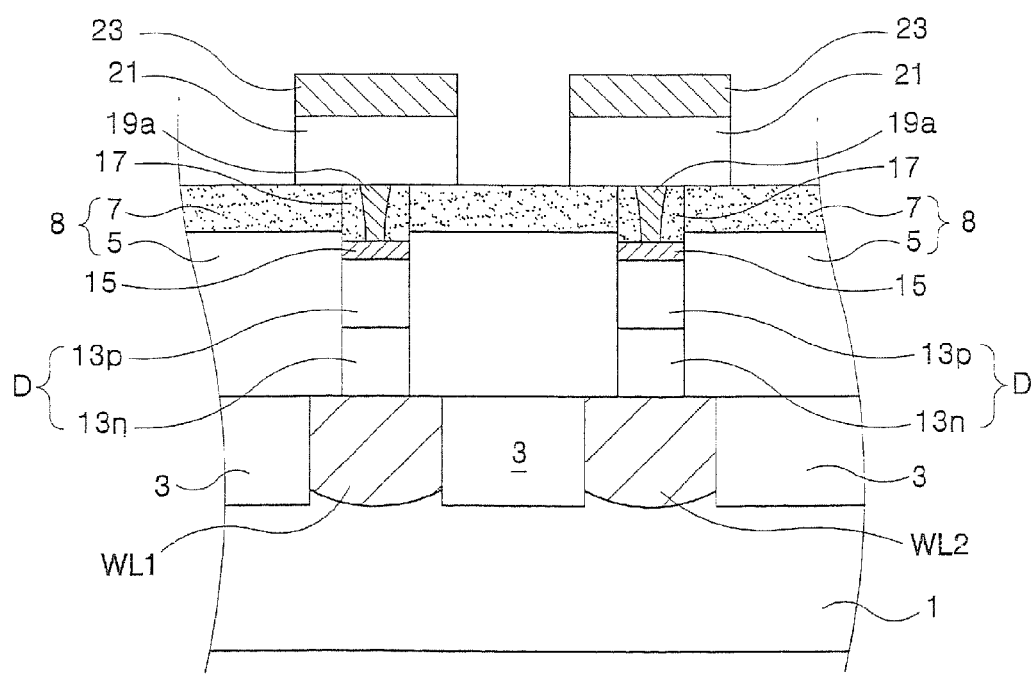

Referring next to FIGS. 10A and 10B, the sacrificial layer (9 of FIGS. 9A and 9B) is removed to expose the second lower insulating layer 7. As a result, the preliminary bottom electrodes 19 and the insulating spacers 17 are relatively protruded. The protruded preliminary bottom electrodes 19 and the protruded insulating spacers 17 may then be planarized using the second lower insulating layer 7 as a polishing stop layer. Thus, bottom electrodes 19a may be formed on the vertical cell diodes D, and top surfaces of the bottom electrodes 19a may have substantially a same level as the top surface of the second lower insulating layer 7. In this case, the top surface areas of the bottom electrodes 19a may be smaller than horizontal section areas of the cell contact holes 9a. Further, the bottom electrodes 19a may be self-aligned with the vertical cell diodes D by the cell contact holes 9a.

A phase change material layer and a top electrode layer are sequentially formed on the substrate 1 in the region including the bottom electrodes 19a. The phase change material layer may be formed of a chalcogenide layer, such as an alloy layer of germanium, stibium and tellurium (GST alloy layer), and the top electrode layer may be formed of a conductive layer, such as a titanium nitride layer. Further, the phase change material layer may be formed using a physical vapor deposition technique, such as a sputtering technique that exhibits poor step coverage. Nevertheless, the phase change material layer may be formed to a uniform thickness throughout the semiconductor substrate 1 as the substrate having the bottom electrodes 19a may have a flat surface. The top electrode layer and the phase change material layer are patterned to form a plurality of phase change material patterns 21 covering the bottom electrodes 19a. Top electrodes 23 may be stacked on the phase change material patterns 21.

Figure 11A:
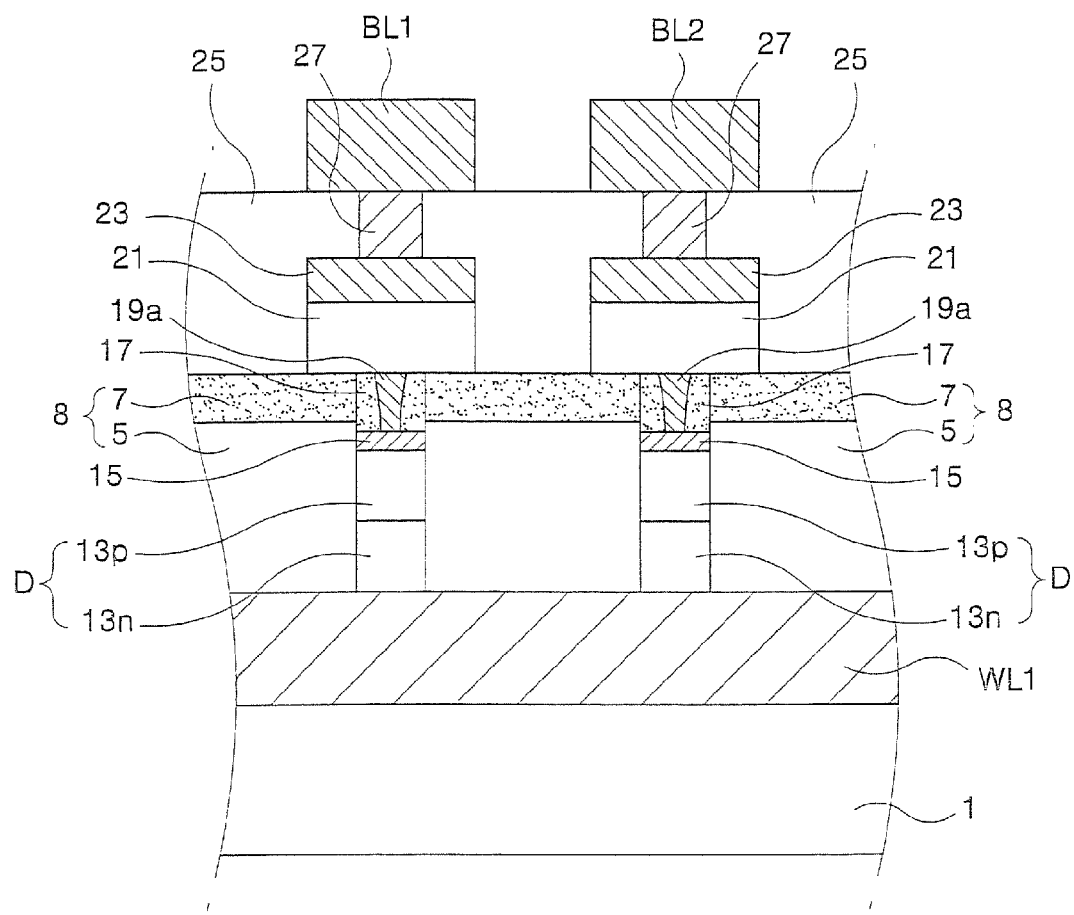
Figure 11B:
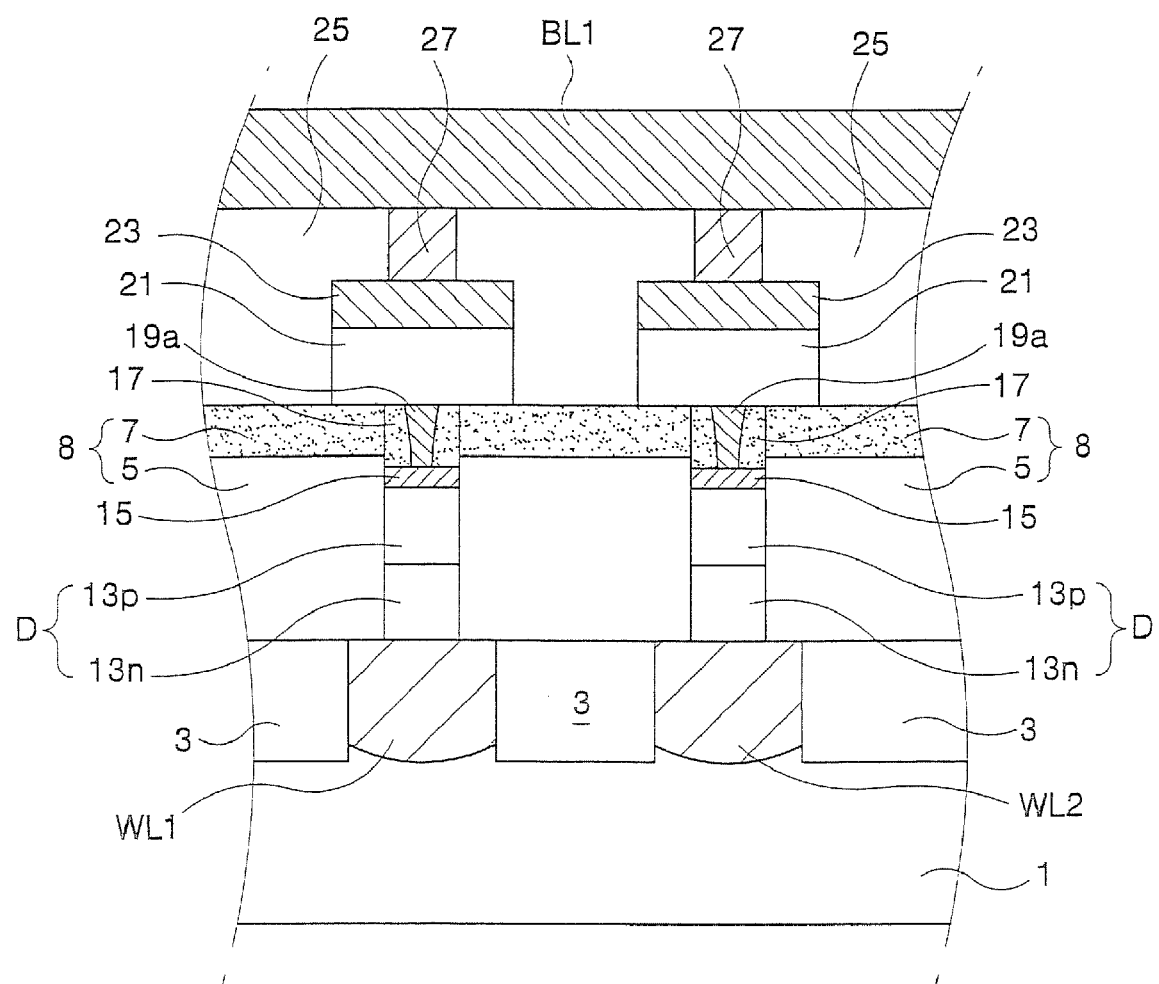

Referring now to FIGS. 11A and 11B, an upper insulating layer 25 is formed on the substrate 1 in the region including the top electrodes 23. The upper insulating layer 25 is patterned to form bit line contact holes exposing the top electrodes 23. Bit line contact plugs 27 are formed in the bit line contact holes and a plurality of bit lines BL1 and BL2 are formed that contact the bit line contact plugs 27. The bit lines BL1 and BL2 may be formed to cross over the word lines WL1 and WL2.

Methods of fabricating phase change memory cells according to other embodiments of the present invention will now be described with reference to FIG. 2 and FIGS. 12A through 15B. FIGS. 12A through 15A are cross-sectional views taken along line I-I' of FIG. 2 and FIGS. 12B through 15B are cross-sectional views taken along line II-II' of FIG. 2.

Figure 12A:
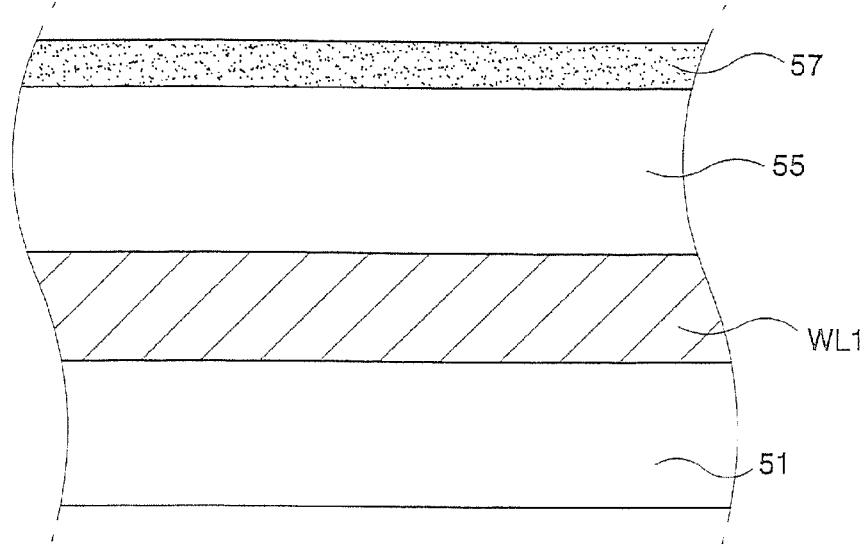
Figure 12B:
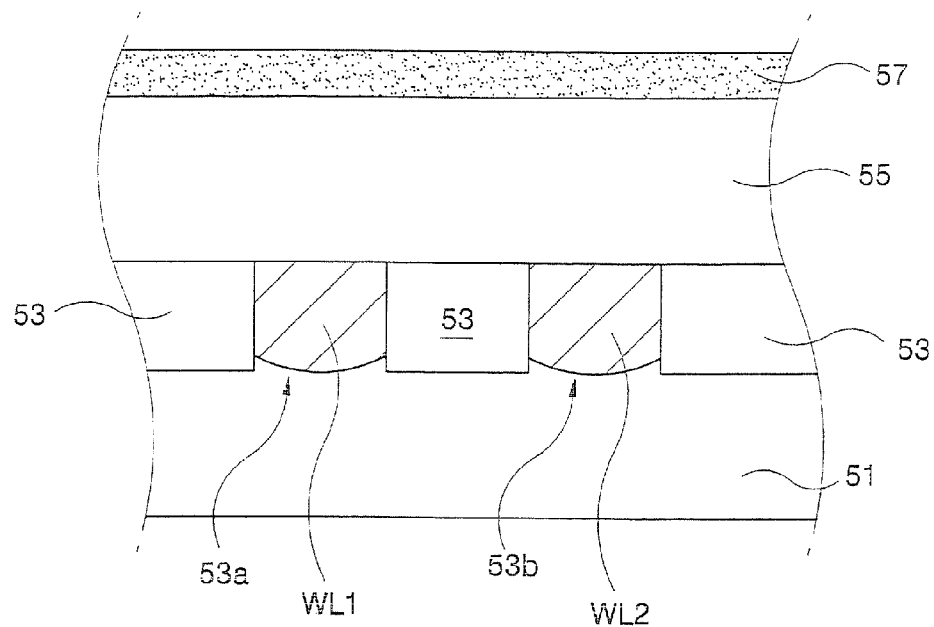

Referring to FIGS. 12A and 12B, a plurality of word lines WL1 and WL2 with an insulating layer 53 therebetween may be formed using substantially the same method as described with reference to FIGS. 5A and 5B. A lower insulating layer 55 and a sacrificial layer 57 are formed on the substrate 51 in a region including the word lines WL1 and WL2. In the illustrated embodiments of FIGS. 12A and 12B, the lower insulating layer 55 is formed of a single lower insulating layer. The lower insulating layer 55 may be formed, for example, of a single silicon oxide layer. The sacrificial layer 57 may be formed of a material layer having an etch selectivity with respect to the lower insulating layer 55. For example, the sacrificial layer 57 may be formed of a silicon oxynitride layer and/or a silicon nitride layer.

Figure 13A:
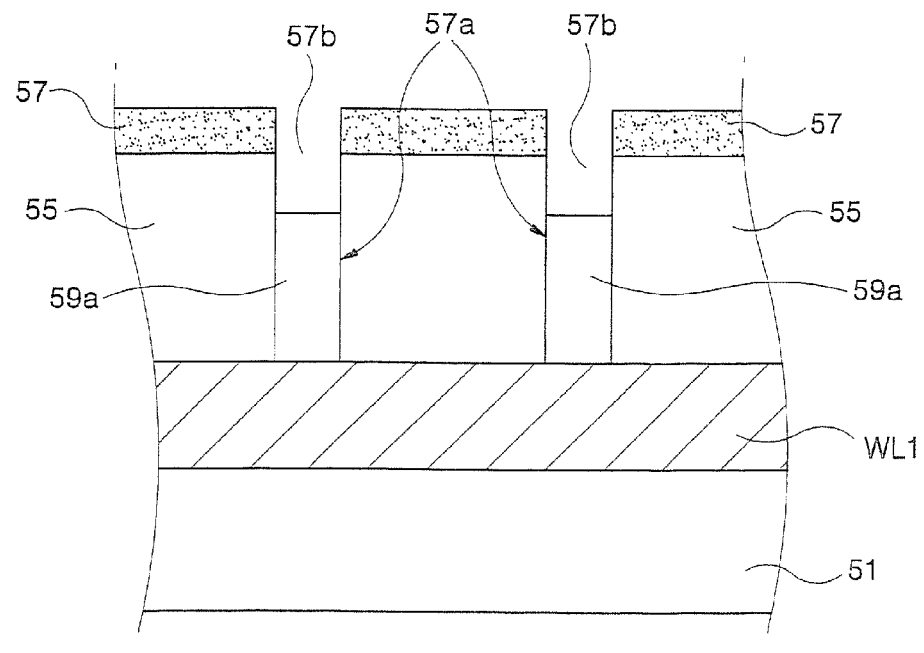
Figure 13B:
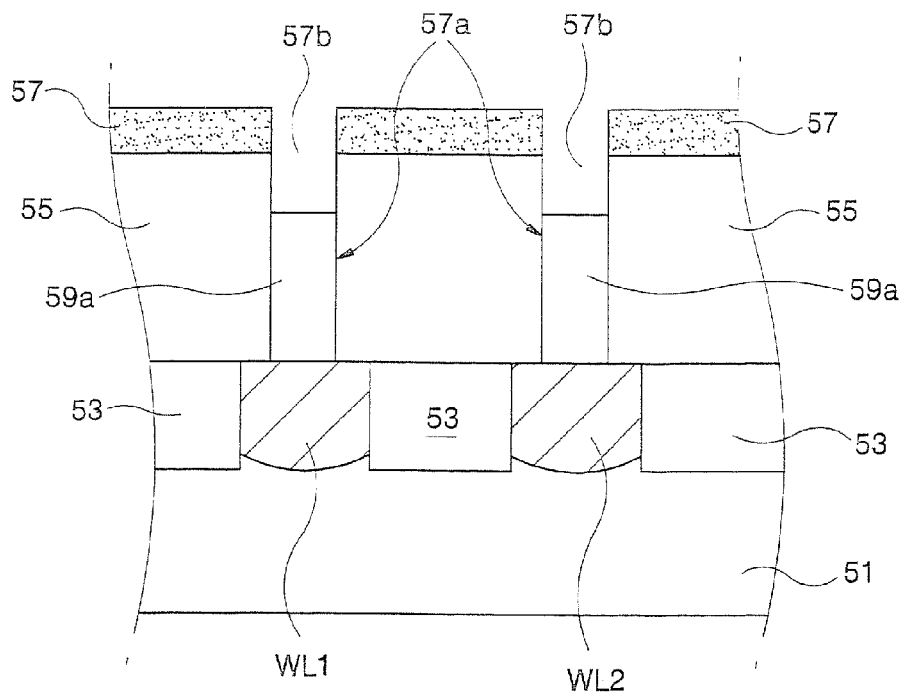

Referring next to FIGS. 13A and 13B, the sacrificial layer 57 and the lower insulating layer 55 are patterned to form cell contact holes 57a exposing predetermined regions of the word lines WL1 and WL2. Recessed semiconductor patterns 59a may be formed in lower regions of the cell contact holes 57a using substantially the same method as described with reference to FIGS. 7A, 7B, 8A and 8B. The recessed semiconductor patterns 59a may be formed to have lower surfaces than a top surface of the lower insulating layer 55. As a result, upper cell contact holes 57b may be provided on the recessed semiconductor patterns 59a.

Figure 14A:
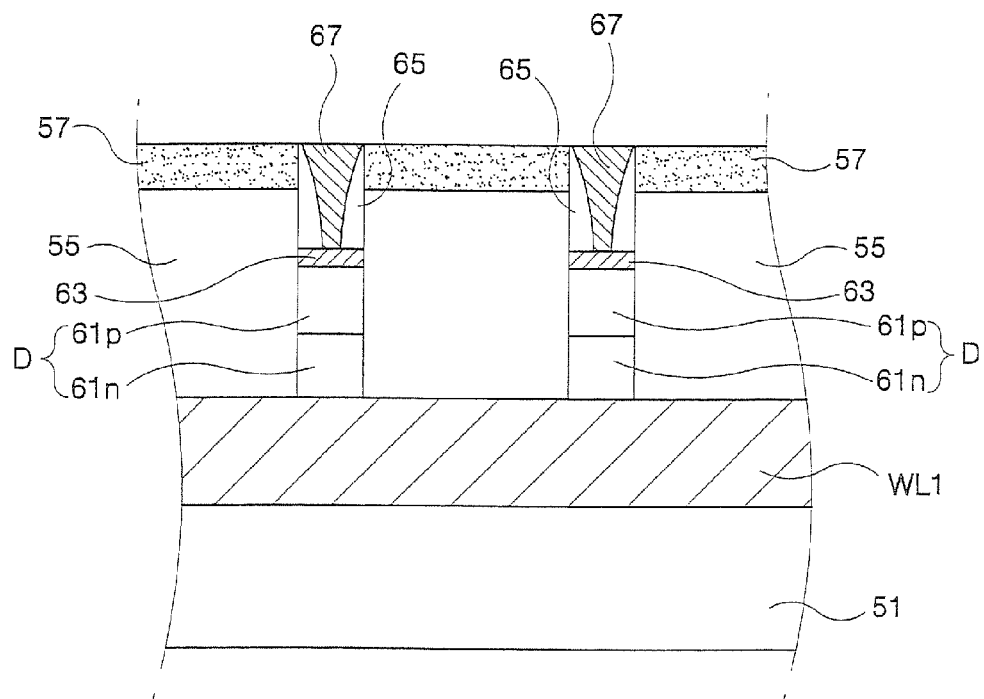
Figure 14B:
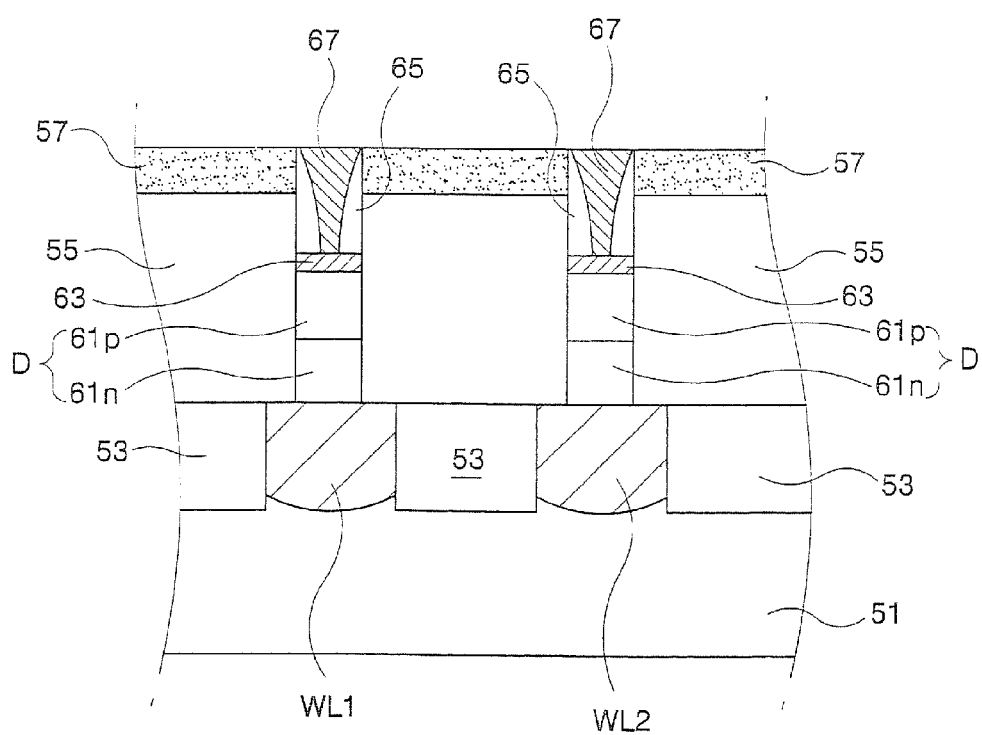

Referring now to FIGS. 14A and 14B, impurity ions may be implanted into the recessed semiconductor patterns 59a to form vertical cell diodes D. The vertical cell diodes D may be formed using substantially the same method as described previously with reference to FIGS. 8A and 8B. As a result, each of the vertical cell diodes D may be formed to include an n-type semiconductor 61n and a p-type semiconductor 61p. Cell diode electrodes 63 may be formed on top surfaces of the vertical cell diodes D. The cell diode electrodes 63 may also be formed using substantially the same method as described previously with reference to FIGS. 8A and 8B.

Insulating spacers 65 may be formed on sidewalls of the upper cell contact holes 57b using a conventional method. The insulating spacers 65 may be formed of an insulating layer having an etch selectivity with respect to the sacrificial layer 57. For example, the insulating spacers 65 may be formed of a silicon oxide layer. The cell diode electrodes 63 may be formed after formation of the insulating spacers 65 as described previously with reference to FIGS. 9A and 9B.

A bottom electrode layer may be formed on the substrate 51 in a region including the cell diode electrodes 63 and the insulating spacers 65, and the bottom electrode layer may be planarized to expose a top surface of the sacrificial layer 57. As a result, preliminary bottom electrodes 67 contacting the cell diode electrodes 63 may be formed in the upper cell contact holes 57b surrounded by the insulating spacers 65. The bottom electrode layer may be formed of a conductive layer, such as a titanium nitride (TiN) layer, a titanium aluminum nitride (TiAlN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium boron nitride (TiBN) layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum aluminum nitride (MoAlN) layer, a tantalum silicon nitride (TaSiN) layer, a tantalum aluminum nitride (TaAlN) layer, a titanium tungsten (TiW) layer, a titanium aluminum (TiAl) layer, a titanium oxynitride (TiON) layer, a titanium aluminum oxynitride (TiAlON) layer, a tungsten oxynitride (WON) layer and/or a tantalum oxynitride (TaON) layer.

Figure 15A:
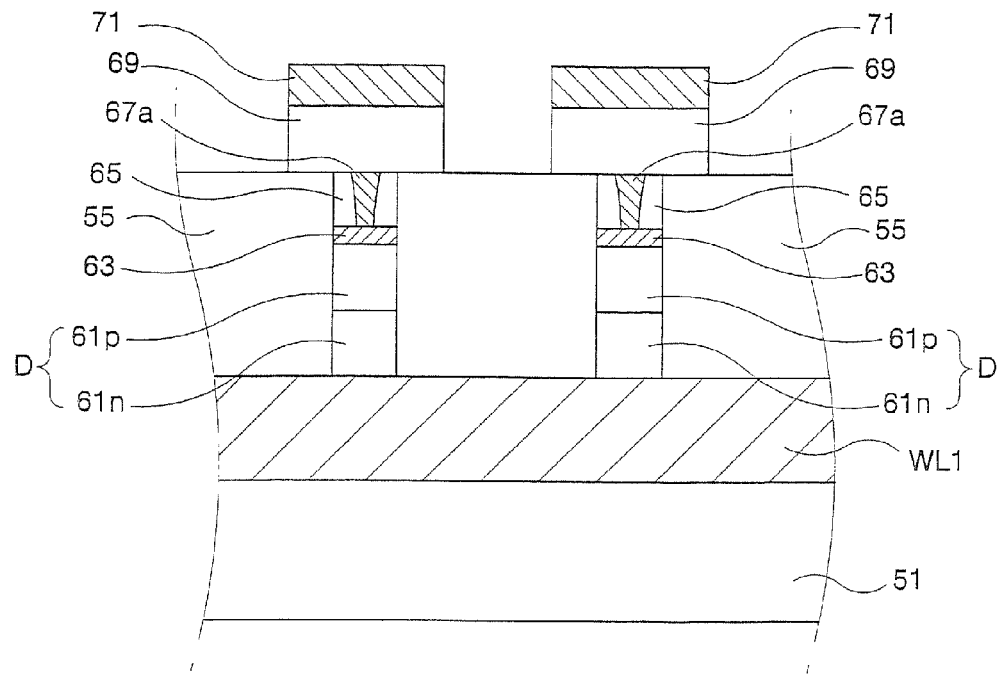
Figure 15B:
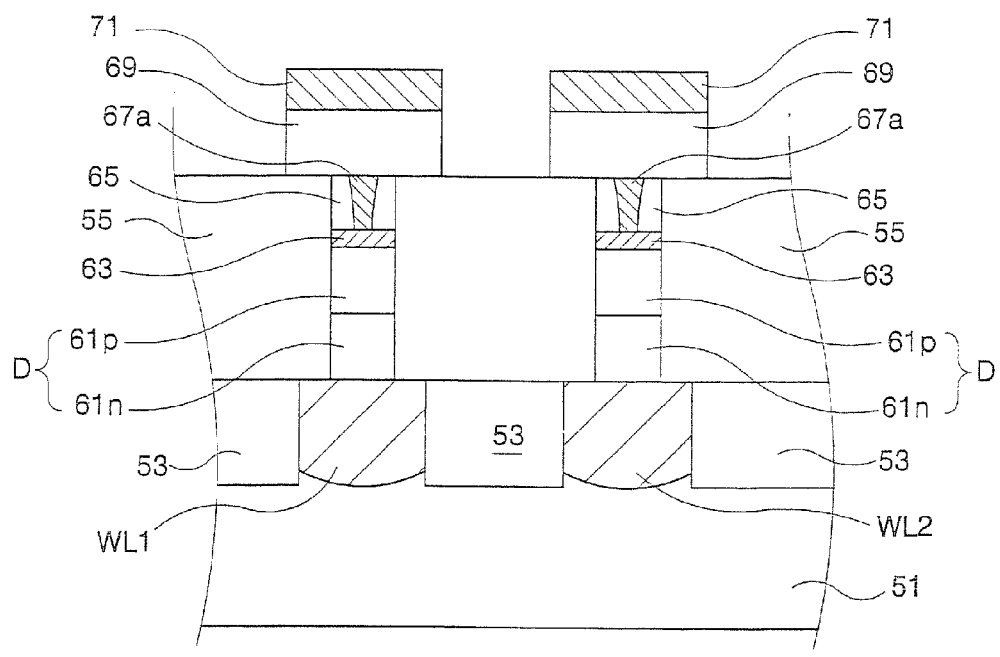

Referring now to FIGS. 15A and 15B, the sacrificial layer 57 is removed resulting in the preliminary bottom electrodes 67 and the insulating spacers 65 protruding above the lower insulating layer 55. The protruded preliminary bottom electrodes 67 and the protruded insulating spacers 65 may then be planarized using the lower insulating layer 55 as a polishing stop layer. As a result, bottom electrodes 67*a* may be formed on the vertical cell diodes D, and top surfaces of the bottom electrodes 67*a* may have substantially a same level as the top surface of the lower insulating layer 55. As a result, top surface areas of the bottom electrodes 67*a* may be smaller than the horizontal section areas of the vertical cell diodes D. Further, the bottom electrodes 67*a* may be self-aligned with the vertical cell diodes D.

Phase change material patterns 69 and top electrodes 71 may be formed on the substrate 51 in the region including the bottom electrodes 67*a* using substantially the same method as described previously with reference to FIGS. 10A and 10B. An upper insulating layer and bit lines may then be formed on the substrate 51 in the region including the top electrodes 71 using substantially the same method as described previously with reference to FIGS. 11A and 11B.

According to some embodiments of the present invention as described above, vertical cell diodes are provided in lower regions of cell contact holes and bottom electrodes are disposed on the vertical cell diodes. The bottom electrodes in some embodiments are self-aligned with the vertical cell diodes by the cell contact holes. Further, any additional photolithography process may not be required to form the bottom electrodes. As a result, an integration density of a phase change memory device including the vertical cell diodes may be increased without using more complicated processes. In addition, the bottom electrodes may be surrounded by insulating spacers and a lower insulating layer, which may be formed of a silicon oxide layer exhibiting lower heat conductivity than a silicon nitride layer and a silicon oxynitride layer. As a result, in some embodiments, loss of joule heat generated from the bottom electrodes may be reduced, which may improve a program efficiency of the phase change material patterns contacting the bottom electrodes.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the strictures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. An integrated circuit device including a vertical diode, comprising:
    an integrated circuit substrate;
    an insulating layer on the integrated circuit substrate;
    a contact hole penetrating the insulating layer;
    a vertical diode in a lower region of the contact hole; and
    a bottom electrode in the contact hole and having a bottom surface on a top surface of the vertical diode, the bottom electrode being self-aligned with the vertical diode and having a top surface area that is less than a horizontal section area of the contact hole.

2. The device of claim 1, wherein the integrated circuit device comprises a phase change memory device.

3. The device of claim 2, wherein the top surface of the bottom electrode has a level relative to the integrated circuit substrate substantially the same as a top surface of the insulating layer.

4. The device of claim 1, further comprising an insulating spacer surrounding a sidewall of the bottom electrode, wherein an outer sidewall of the insulating spacer is self-aligned with a sidewall of the vertical diode by the contact hole.

5. The device of claim 4, wherein the insulating layer and the insulating spacer comprise a same material.

6. The device of claim 5, wherein the insulating layer and the insulating spacer comprise silicon oxide.

7. The device of claim 1, further comprising a diode electrode between the bottom electrode and the vertical diode.

8. The device of claim 1, further comprising a memory storage element electrically coupled to the bottom electrode and a cell select line on the integrated circuit substrate and electrically coupled to the bottom electrode through the vertical diode to define a memory cell.

9. The device of claim 8, wherein the memory storage element includes:
    a phase change material pattern layer on the bottom electrode; and
    a top electrode on the phase change material pattern layer.

10. The device of claim 1, wherein the insulating layer comprises:
    a first insulating layer on the integrated circuit substrate; and
    a second insulating layer on the first insulating layer, the second insulating layer having an etch selectivity with respect to the first insulating layer.

11. A phase change memory cell comprising:
    an insulating layer on an integrated circuit substrate;
    a cell contact hole penetrating the insulating layer;
    a vertical cell diode in a lower region of the cell contact hole;
    a bottom electrode in the cell contact hole on the vertical cell diode and self-aligned with the vertical cell diode;
    a phase change material layer pattern on the bottom electrode; and
    an top electrode on the phase change material layer pattern.

12. The phase change memory cell of claim 11, wherein a top surface of the bottom electrode has a substantially same level as a top surface of the insulating layer.

13. The phase change memory cell of claim 11, further comprising an insulating spacer surrounding a sidewall of the bottom electrode and wherein an outer sidewall of the insulating spacer is self-aligned with a sidewall of the vertical cell diode by the cell contact hole.

14. The phase change memory cell of claim 13, wherein a top surface area of the bottom electrode is less than a horizontal section area of the cell contact hole.

15. The phase change memory cell of claim 13, wherein the insulating layer comprises a single layer and wherein the insulating layer is a same material as the insulating spacer.

16. The phase change memory cell of claim 13, wherein the insulating layer comprises:
    a first insulating layer on the integrated circuit substrate; and
    a second insulating layer on the first insulating layer, wherein the second insulating layer is an insulating layer having an etch selectivity with respect to the first insulating layer.

17. The phase change memory cell of claim 16, wherein the second insulating layer is a same material as the insulating spacer.

18. The phase change memory cell of claim 11, further comprising a cell diode electrode between the bottom electrode and the vertical cell diode.

19. The phase change memory cell of claim 11, wherein the phase change material pattern covers the bottom electrode.

20. The phase change memory cell of claim 19, further comprising:
- an upper insulating layer on the phase change material pattern and the top electrode; and
- a bit line on the upper insulating layer and electrically connected to the top electrode through a bit line contact hole penetrating the upper insulating layer.

21. The phase change memory cell of claim 11, further comprising a word line disposed on the integrated circuit substrate, wherein the cell contact hole extends through the insulating layer to expose a portion of the word line and wherein the insulating layer comprises a single layer.

22. The phase change memory cell of claim 21, wherein the word line comprises an n-type impurity region.

23. The phase change memory cell of claim 21, wherein the insulating layer comprises a silicon oxide layer.

24. The phase change memory cell of claim 23, further comprising a silicon oxide spacer surrounding a sidewall of the bottom electrode, wherein an outer sidewall of the silicon oxide spacer is self-aligned with a sidewall of the vertical cell diode by the cell contact hole.

25. The phase change memory cell of claim 24, wherein a top surface area of the bottom electrode is less than a horizontal section area of the cell contact hole.

26. The phase change memory cell of claim 21, further comprising a cell diode electrode between the bottom electrode and the vertical cell diode.

27. The phase change memory cell of claim 21, further comprising:
- an upper insulating layer covering the phase change material pattern and the top electrode; and
- a bit line on the upper insulating layer and electrically connected to the top electrode through a bit line contact hole penetrating the upper insulating layer, the bit line being disposed to cross over the word line.

28. The phase change memory cell of claim 11, further comprising a word line disposed on the integrated circuit substrate, wherein the cell contact hole extends through the insulating layer to expose a portion of the word line and wherein the insulating layer comprises a first insulating layer on the substrate including the word line and a second insulating layer on the first insulating layer.

29. The phase change memory cell of claim 28, wherein a top surface of the bottom electrode has a substantially same level as a top surface of the second insulating layer.

30. The phase change memory cell of claim 29, wherein the word line comprises an n-type impurity region.

31. The phase change memory cell of claim 29, wherein the first insulating layer is a silicon oxide layer, and the second insulating layer is a silicon oxynitride layer and/or a silicon nitride layer.

32. The phase change memory cell of claim 31, further comprising an insulating spacer surrounding a sidewall of the bottom electrode, wherein an outer sidewall of the insulating spacer is self-aligned with a sidewall of the vertical cell diode by the cell contact hole and wherein the insulating spacer is a silicon oxynitride spacer and/or a silicon nitride spacer.

33. The phase change memory cell of claim 32, wherein a top surface area of the bottom electrode is less than a horizontal section area of the cell contact hole.

34. The phase change memory cell of claim 29, further comprising a cell diode electrode between the bottom electrode and the vertical cell diode.

35. The phase change memory cell of claim 34, further comprising:
- an upper insulating layer covering the phase change material pattern and the top electrode; and
- a bit line on the upper insulating layer and electrically connected to the top electrode through a bit line contact hole penetrating the upper insulating layer, the bit line being disposed to cross over the word line.

* * * * *